(12) United States Patent
Singh et al.

(10) Patent No.: US 7,727,364 B2
(45) Date of Patent: Jun. 1, 2010

(54) AUXILIARY ELECTRODE ENCASED IN CATION EXCHANGE MEMBRANE TUBE FOR ELECTROPLATING CELL

(75) Inventors: Saravjeet Singh, Santa Clara, CA (US); Hooman Hafezi, Redwood City, CA (US); Manoocher Birang, Los Gatos, CA (US); Aron Rosenfeld, Palo Alto, CA (US); Joseph Behnke, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1131 days.

(21) Appl. No.: 11/362,432

(22) Filed: Feb. 24, 2006

(65) Prior Publication Data
US 2006/0243598 A1 Nov. 2, 2006

Related U.S. Application Data

(60) Provisional application No. 60/656,161, filed on Feb. 25, 2005, provisional application No. 60/687,404, filed on Jun. 3, 2005.

(51) Int. Cl.
*C25D 17/12* (2006.01)
*C25D 7/12* (2006.01)

(52) U.S. Cl. .................................................. 204/230.7

(58) Field of Classification Search ............... 204/230.7
See application file for complete search history.

(56) References Cited

U.S. PATENT DOCUMENTS

| 4,466,864 A | 8/1984 | Bacon et al. |
| 5,744,019 A | 4/1998 | Ang |
| 5,883,762 A | 3/1999 | Calhoun et al. |
| 6,004,440 A | 12/1999 | Hanson et al. |
| 6,071,388 A | 6/2000 | Uzoh |

(Continued)

OTHER PUBLICATIONS

PCT International Search Report and Written Opinion dated Nov. 8, 2007 for International Application No. PCT/US2006/06839.

(Continued)

*Primary Examiner*—Harry D Wilkins, III
(74) *Attorney, Agent, or Firm*—Patterson & Sheridan

(57) ABSTRACT

A method and apparatus for plating a metal onto a substrate. One embodiment of the invention provides an apparatus for electrochemically plating a substrate. The apparatus comprises a fluid basin configured to retain a plating solution therein, an anode assembly disposed in the fluid basin, a substrate support member configured to support the substrate and contact the substrate electrically, and an encased auxiliary electrode assembly disposed in the fluid basin. The encased auxiliary electrode assembly generally comprises an auxiliary electrode disposed in a protective tube.

27 Claims, 19 Drawing Sheets

U.S. PATENT DOCUMENTS

| | | |
|---|---|---|
| 6,228,231 B1 | 5/2001 | Uzoh |
| 6,228,232 B1 | 5/2001 | Woodruff et al. |
| 6,261,433 B1 | 7/2001 | Landau |
| 6,270,647 B1 | 8/2001 | Graham et al. |
| 6,322,674 B1 | 11/2001 | Berner et al. |
| 6,436,249 B1 | 8/2002 | Patton et al. |
| 6,627,051 B2 | 9/2003 | Berner et al. |
| 6,773,571 B1 | 8/2004 | Mayer et al. |
| 6,802,946 B2 | 10/2004 | Basol et al. |
| 6,802,947 B2 | 10/2004 | Olgado et al. |
| 2002/0125140 A1 | 9/2002 | Uzoh et al. |
| 2003/0079995 A1 | 5/2003 | Contolini et al. |
| 2004/0016636 A1 | 1/2004 | Yang et al. |
| 2004/0226826 A1 | 11/2004 | Cheng et al. |

OTHER PUBLICATIONS

Frackowiak, et al article. "Carbon Materials for the Electrochemical Storage of Energy in Capacitors", Carbon 39 (2001) pp. 937-950.

Yang, et al article. "Electrosorption Capacitance of Nanostructured Carbon Aerogel Obtained by Cyclic Voltammetry", Journal of Electroanalytical Chemistry 540 (2003), pp. 159-167.

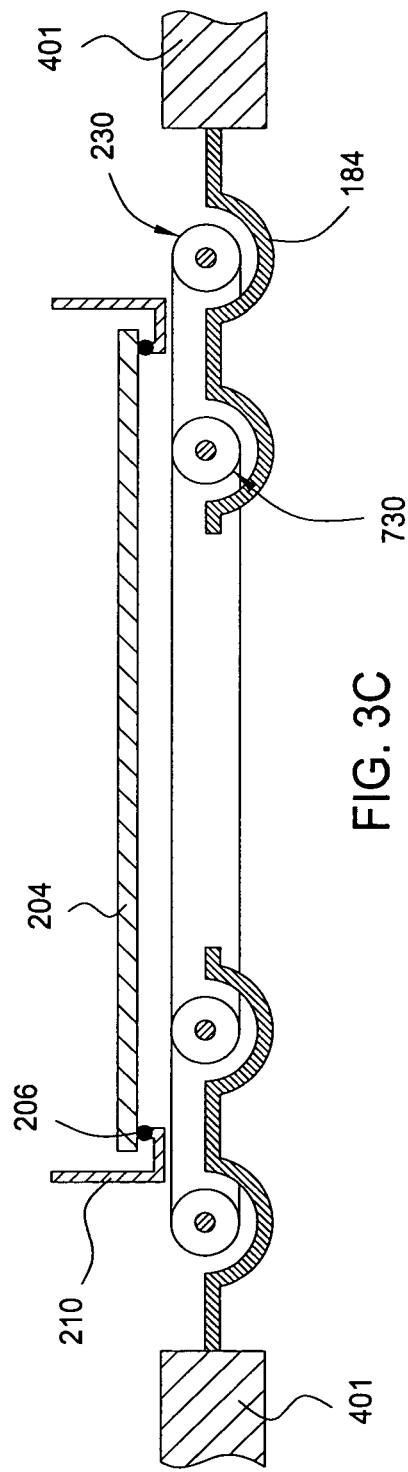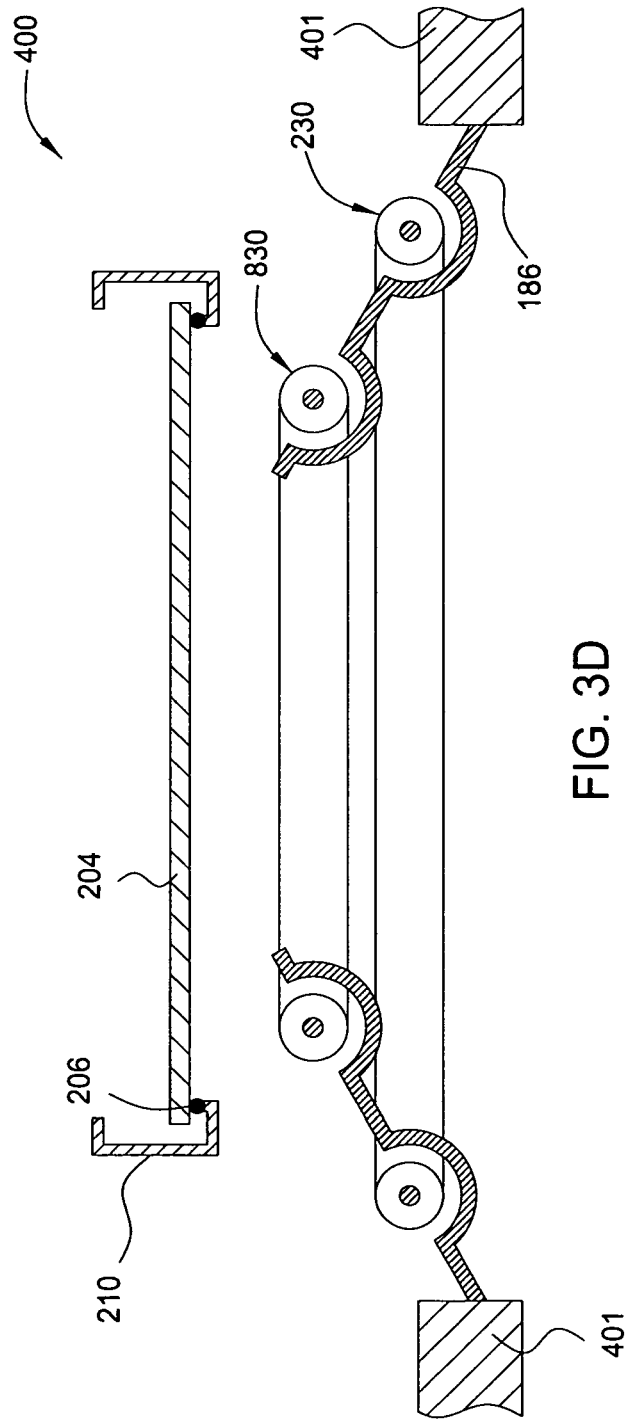

AUXILIARY ELECTRODE ENCASED IN CATION EXCHANGE MEMBRANE TUBE FOR ELECTROPLATING CELL

CROSS-REFERENCE TO RELATED APPLICATIONS

This application claims benefit of U.S. Provisional Patent Application Ser. No. 60/656,161, filed Feb. 25, 2005, and U.S. Provisional Patent Application Ser. No. 60/687,404, filed Jun. 3, 2005, which are herein incorporated by reference.

BACKGROUND OF THE INVENTION

1. Field of the Invention

Embodiments of the invention generally relate to an encased electrode assembly in fluid communication with electrolyte of an electrochemical cell.

2. Description of the Related Art

Metallization of high aspect ratio 90 nm and smaller sized features is a foundational technology for future generations of integrated circuit manufacturing processes. Metallization of these features is generally accomplished via an electrochemical plating process. In a typical process scheme, a metal, such as copper, is plated onto a substrate comprising an array of integrated circuit devices with open vias and trenches. The plating process is carried out in such a manner as to fill the vias and trenches on the substrate surface with metal and to further deposit an additional amount of metal known as the overburden on the substrate. The overburden is required to enable subsequent polishing and planarization of the deposit through a process step such as chemical mechanical polishing. The total amount of metal deposited in the electrochemical plating process is typically 0.2 to 1 µm.

However, electrochemical plating (ECP) of these features presents several challenges to conventional gap fill methods and apparatuses. One such problem, for example, is that electrochemical plating processes generally require a conductive seed layer to be deposited onto the features to support the subsequent plating process. Conventionally, these seed layers have had a thickness of between about 1000 Å and about 2500 Å; however, as a result of the high aspect ratios of 90 nm features, seed layer thicknesses must be reduced to less than about 500 Å, or even below 100 Å. This reduction in the seed layer thickness increases resistivity of the substrate causing a "terminal effect," which is an increase in the deposition thickness near the perimeter of the substrate being plated.

The terminal effect is most severe at the beginning of an electrochemical plating process, for example, within about the first 10 seconds of the electrochemical plating process, when the substrate resistivity is at the highest level. This stage is also the critical stage when the features on the substrates are being filled. The terminal effect results in a large difference in the plating rate across the substrate, leading to variations in film properties such as film composition and resistivity between the center and edge of the substrate. More importantly, a highly non-uniform plating rate across the substrate during the filling of features forces the features at either the center or edge of the wafer to fill under sub-optimal conditions, resulting in problems, such as incomplete filling and trapped voids inside the features.

Additionally, it is often desirable to modulate the plating rate at the edge of the substrate after the features have been filled and while the overburden is being deposited. For example, processes that follow electrochemical plating, such as chemical mechanical polishing, may yield better performance if the plated film is thinner at the edge than at the center of the wafer. This is because certain polishing processes are edge-slow (edge fast), so that a slightly edge-thin (edge thick) deposit profile after plating results in an optimally uniform profile after polishing.

Therefore, control of the plating rate at the edge of the substrate is desired to mitigate the terminal effect and adjust the overall plating profile. Attempts have been made modulate the plating profile at the edge of the substrate through various apparatus and methods. For example, an electrochemical polishing following the electrochemical plating process generally prefers an edge thin profile. These configurations were generally unsuccessful in controlling the terminal effect because of their lack of proximity to the perimeter of the substrate.

Additionally, conventional cells have been modified to include thief electrodes in the anolyte compartment near the edge of the substrate being plated. The thief electrodes is usually biased during plating to adjust the electric field near the vicinity of the edge of the substrate to reduce the terminal effect. However, thief electrodes introduce problems. For example, the thief electrodes usually generate defects, such as metal sludge, during operation or at rest. The use of thief electrodes also increases the breakdown rate of critical additives in the catholyte resulting in increased consumption of chemicals. Therefore, for thief electrodes to work effectively, improvement needs to be done to reduce generation of defects and consumption of chemicals.

Therefore, there exists a need for an apparatus and method for minimizing terminal effect and/or adjusting plating profile.

SUMMARY OF THE INVENTION

The present invention is directed to an electrochemical plating cell with an encased auxiliary electrode assembly.

One embodiment of the present invention provides an apparatus for electrochemically plating a substrate. The apparatus comprises a fluid basin configured to retain a plating solution therein, an anode assembly disposed in the fluid basin, a substrate support member configured to support the substrate and contact the substrate electrically, and an encased auxiliary electrode assembly disposed in the fluid basin.

Another embodiment of the present invention provides an electrochemical plating cell. The electrochemical plating cell comprises an anolyte compartment positioned in a lower portion of a fluid basin, an anode positioned in the anolyte compartment, and a catholyte compartment. The catholyte compartment is positioned in an upper portion of the fluid basin and in ionic communication with the anolyte compartment via a cationic membrane. The electrochemical plating cell further comprises a cathode substrate support member positioned to support a substrate at least partially in the catholyte compartment, and an encased auxiliary electrode assembly. The encased auxiliary electrode assembly comprises an auxiliary electrode disposed in a protective tube, positioned in the catholyte compartment.

Yet another embodiment of the present invention provides a method for plating a metal onto a substrate. The method comprises positioning the substrate in a plating position in a plating solution, applying a first electrical bias between the substrate and an anode disposed in the plating solution, and during applying the first electrical bias, applying a second electrical bias to an auxiliary electrode, wherein the auxiliary electrode is positioned in a protective tube disposed in the plating solution.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3C is a partial sectional view of FIG. 3B.

FIG. 3D is partial sectional view of an alternative placement of multiple encased auxiliary electrodes in an electrochemical plating cell.

DETAILED DESCRIPTION OF THE PREFERRED EMBODIMENT

The present invention generally provides an electrochemical plating cell, with an encased auxiliary electrode assembly in fluid communication with a plating solution.

Figure 1A:
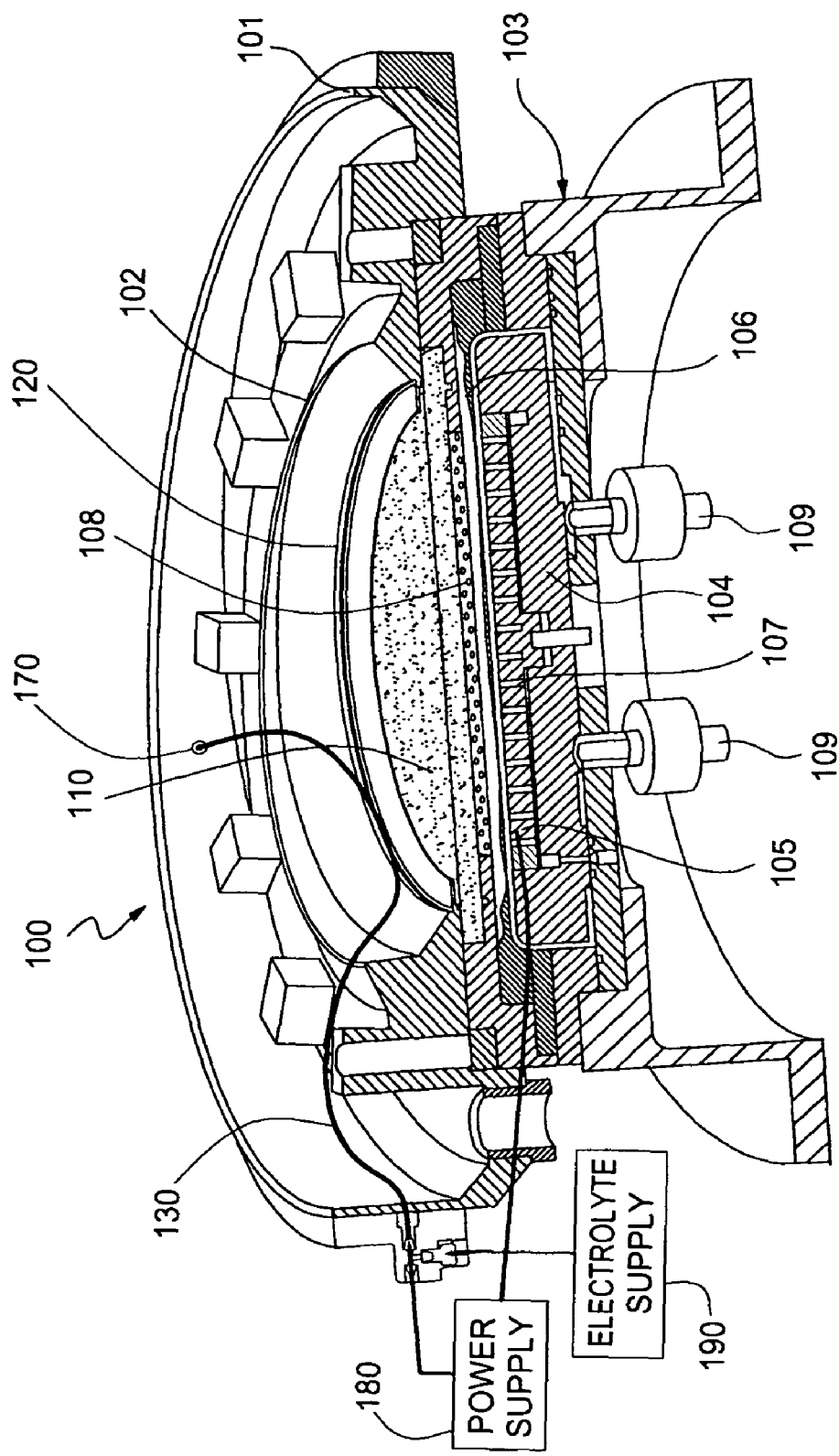
FIG. 1A illustrates a partial sectional perspective view of an exemplary electrochemical plating cell of the invention.

FIG. 1A illustrates a partial sectional perspective view of an exemplary electrochemical plating cell 100 containing an encased auxiliary electrode assembly 130 of the invention. The electrochemical plating cell 100 is illustratively described below in reference to modification of a SlimCell™ system, available from Applied Materials, Inc., Santa Clara, Calif. Detailed description of an electrochemical plating cell used in a SlimCell™ system may be found in co-pending U.S. patent application Ser. No. 10/268,284, filed on Oct. 9, 2002, entitled "Electrochemical Processing Cell", which is incorporated herein by reference. It is attempted that the invention may be utilized in other plating systems having different configurations.

The electrochemical plating cell 100 generally includes an outer basin 101 and an inner basin 102 positioned within the outer basin 101. The encased auxiliary electrode assembly 130 is positioned in a groove 120 located in the lower portion of the inner basin 102 of the plating cell. The inner basin 102 is generally configured to contain a plating solution which is used to plate a metal, e.g., copper, onto a substrate during an electrochemical plating process. As illustrated in FIG. 1A, the electrochemical plating cell 100 is generally positioned at a tilted angle, i.e., a frame portion 103 of the electrochemical plating cell 100 is generally elevated on one side such that the components of electrochemical plating cell 100 are tilted between about 5 degrees and about 35 degrees.

A disk shaped anode 105 is generally disposed in an anode base member 104 positioned near the bottom of the inner basin 102. The electrochemical plating cell 100 further comprises a membrane support assembly 106 configured to support a membrane 108. The membrane support assembly 106 is generally secured at an outer periphery thereof to the anode base member 104, and includes an interior region that is configured to allow fluids to pass therethrough via a sequence of oppositely positioned slots, bores, or other fluid apertures (not shown). The membrane support assembly 106 may include an o-ring type seal (not shown) positioned near a perimeter of the membrane 108, wherein the seal is configured to prevent fluids from traveling from one side of the membrane 108 secured on the membrane support assembly 106 to the other side of the membrane 108 without passing through the membrane 108 itself. The membrane 108, the membrane support assembly 106, and the anode base member 104 form an anodic chamber near the anode 105 in the lower part of the inner basin 102. A catholytic chamber is formed above the membrane 108 inside the inner basin 102.

During a plating process, a catholyte solution, the solution used to contact the substrate and plate a metal onto the substrate, is supplied to and circulated in the catholytic chamber and an anolyte solution is generally supplied to and circulated in the anodic chamber. The catholyte solution, also called the plating solution, generally comprises a virgin makeup plating solution and one or more plating additives configured to provide a level of control over the plating process, such as levelers, suppressors, or accelerators. The anolyte solution may be simply the catholyte solution without the plating additives. Detailed description of composition and supply of catholyte and anolyte in an electrochemical plating cell may be found in U.S. patent application Ser. No. 10/616,284, filed on Jul. 8, 2003, entitled "Multi-Chemistry Plating System", which is incorporated herein by reference.

The electrochemical plating cell 100 further comprises a diffuser plate 110 disposed in the inner basin 102 above the membrane 108. The diffuser plate 110, which is generally a ceramic or other porous disk shaped member, operates as a fluid flow restrictor to even out the flow pattern across the substrate.

Figure 1C:
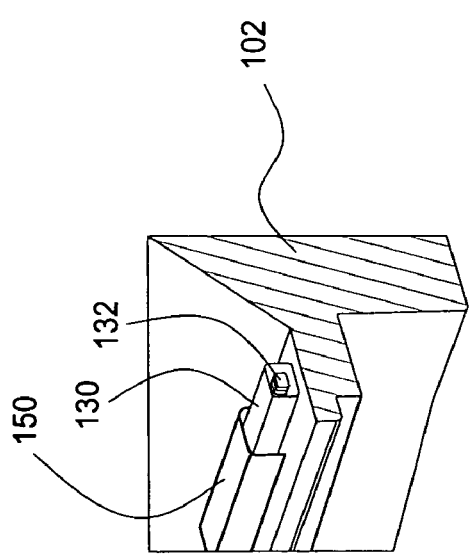
FIG. 1C illustrates an enlarged view of the wall of the outer basin of the electrochemical plating cell displayed in FIG. 1A showing how the encased auxiliary electrode assembly enters the basin of the electrochemical plating cell.

Referring to FIG. 1C, the encased auxiliary electrode assembly 130 is composed of an auxiliary electrode 132 surrounded by electrolyte in a protective tube 134. In another embodiment, the electrolyte is absent from the protective tube 134 and the protective tube is attached directly to the surface of the auxiliary electrode. The encased auxiliary electrode assembly 130 is used to adjust the electric field, hence the plating rate, near a perimeter of a substrate being processed. Also, when configured as a cathode, the encased auxiliary electrode assembly 130 can be used (when the substrate contacts are configured as anodes) as a cathode for deplating copper that accumulates on the substrate contacts. The protective tube 134 of the encased auxiliary electrode assembly 130 prevents organics presented in the catholyte solution from entering the encased auxiliary electrode assembly 130 while also preventing copper sludge and plated copper formed within the encased auxiliary electrode assembly 130 from exiting the protective tube 134 and contaminating the catholyte solution.

The auxiliary electrode 132 is comprised of platinum, but may alternatively be manufactured from copper or other metals suitable for use as either a soluble or insoluble electrode in an electrochemical plating cell. Additionally, the auxiliary electrode 132 may be manufactured from a core material, such as stainless steel, titanium, or suitable material, and have outer surfaces, i.e., the upper surface of the auxiliary electrode 132 that is in fluid contact with the electrolyte, plated with another metal, such as platinum, titanium, copper, or other electrode material. This configuration allows the cost of the auxiliary electrode 132 to be reduced, as a more cost effective and electrically conductive material is used to manufacture the core of the auxiliary electrode 132, while another electrode material, i.e., platinum, is used for the outer surface. The auxiliary electrode 132 can be a wire, a ring, a torroid or of other shape.

During the operation of the electrochemical plating cell 100, particles, such as metal sludge, are generated at the auxiliary electrode 132. The protective tube 134 prevents this copper sludge from exiting the encased auxiliary electrode assembly 130 and contaminating the catholyte solution. Further, the protective tube 134 prevents the auxiliary electrode 132 from consuming and degrading the organic additives (levelers, suppressors and activators) in the catholyte solution. The protective tube 134 may be comprised of an ion exchange material such as NAFION®, CMX-SB or Vicor membrane. Also, the protective tube 134 can be comprised of a porous membrane. One example of a hydrophilic porous membrane is the Durapore Hydrophilic Membrane, available from Millipore Corporation, located in Bedford, Mass. Other examples of conventional membranes include porous glass, porous ceramics, silica aerogels, organic aerogels, porous polymeric materials, and filter membranes. Specific membranes include carbon filter layers, KYNAR® polymer layers or polypropylene membranes.

When in a plating configuration, the protective tube 134 allows, metal ions, such as copper ions, to plate onto the auxiliary electrode 132 but does not allow the copper sludge to exit the protective tube and contaminate the catholyte solution, and as such, protective tube 134 is generally an ionic or ion exchange-type membrane. Ion exchange membranes generally include fixed negatively charged groups, such as $SO_3^-$, $COO^-$, $HPO_2^-$, $SeO_3^-$, $PO_3^{2-}$, or other negatively charged groups amenable to plating processes. As such, the protective tube 134 is configured to selectively allow a particular type of ion to travel through the membrane, while preventing other types of ions from traveling or passing through the membrane. More particularly, the protective tube 134 may be a cationic membrane that is configured to allow positively charged copper ions ($Cu^{2+}$ and $H^+$) to pass therethrough, i.e., to allow copper ions to travel from the catholyte solution through the protective tube 134 where the copper ions may then be plated onto the auxiliary electrode 132. Further, the cationic membrane may be configured to prevent passage of negatively charged ions and electrically neutral species in the solution, such as the ions that make up the plating solution and catholyte additives. It is desirable to prevent these catholyte additives from traveling through the protective tube 134 and contacting the auxiliary electrode 132, as the additives are known to breakdown upon contacting the auxiliary electrode 132. More particularly, membranes with negatively charged ion groups like $SO_3^-$, etc., not only operate to facilitate Cu ion transport from the anolyte to the catholyte, but also to prevent penetration of additives to the auxiliary electrode. The additives are generally neutral or negatively charged organic species, such as, for example, $^-SO_3^-$—$C_3H_6$—S—S—$C_3H_6^-$$SO_3^-$, so they can't penetrate into or through the cation membrane and contact the auxiliary electrode where they are consumed and/or depleted.

The protrective tube 134, for example, may be a NAFION® membrane manufactured by Dupont Corporation. The NAFION® membrane is an example of a poly (tetrafluoroethylene) based ionomer. The NAFION® membrane has several desirable characteristics for electrochemical plating applications, such as its thermal and chemical resistance, ion-exchange properties, selectivity, mechanical strength, and insolubility in water. The NAFION® membrane is also a cationic membrane based on a fluorinated polymer matrix. Because of its fluorinated matrix, the NAFION® membrane exhibits excellent chemical stability, even in concentrated basic solutions. More particularly, the NAFION® membrane is a perfluorinated polymer that contains small proportions of sulfonic or carboxylic ionic functional groups, and has been shown to be effective in transmitting metal ions (copper ions in the present embodiment) therethrough, even at low plating current densities. Specifically, the NAFION® membranes have shown to be effective at transmitting between about 93 percent and about 97 percent of copper ions therethrough at plating current densities of between about 5 mA/cm$^2$ and about 20 mA/cm$^2$. Additionally, at current densities of between about 20 mA/cm$^2$ and about 60 mA/cm$^2$, the NAFION® membrane transmits between about 97 percent and about 93 percent of copper ions therethrough. The above noted transmission percentages were observed using a copper sulfate solution having a pH value of about 3.4. The NAFION® general chemical structure (illustrated below as Diagram 1), illustrates where X is either a sulfonic or carboxylic functional group and M is either a metal cation in the neutralized form or an H+ in the acid form.

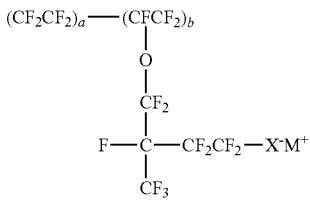

Diagram 1

As a result of electrostatic interactions, the ionic groups that form the NAFION® membrane tend to aggregate to form tightly packed regions referred to as clusters. The presence of these electrostatic interactions between the ions and the ion pairs enhance the intermolecular forces and thereby exert a significant effect on the properties of the parent polymer, which makes the NAFION® membrane, or other membranes having similar physical and/or operational characteristics, a desirable ionic membrane for use in electrochemical plating cells having separated anolyte and catholyte chambers.

Other membranes that may be used in embodiments of the invention include various cationic and anionic membranes. For example, ionic membranes manufactured by Tokuyama of Japan, i.e., CMX-SB ionic membranes that are based on a polydivinilbenzol matrix, may be used to isolate a catholyte solution from an anolyte solution in an electrochemical plating cell. CMX-SB membranes have been shown to be effective in transmitting copper ions while preventing organic plating additives from transmitting therethrough.

Additionally, CMX-SB membranes have shown acceptable resistance to transmission of positive hydrogen ions. More particularly, CMX membranes have been shown to transmit above about 92% of copper ions at a current density of about 10 mA/cm$^2$, and above about 98% at a current density of about 60 mA/cm$^2$. Ionics CR-type membranes from Ionics Inc. have also shown to be able to transmit above about 92% of copper ions at about 10 mA/cm$^2$ and above about 88% of copper ions at about 60 mA/cm$^2$.

With regard to other properties of the above noted membranes (Ionics, CMX, and NAFION® membrane), each exhibit relatively high conductivity, i.e., about 41.2, 35.3, and 24.2 ohm cm$^2$ at 10 mA/cm$^2$ for Ionics, NEOSEPTA® and NAFION® membrane, respectively. Additionally, water moves through the membranes from the anolyte into the catholyte compartment. This effect essentially dilutes the catholyte and is undesirable. For example, between about 0.5 and about 3 liters of water penetrates into the catholyte per 24 hours (or per 200 wafers) depending on the membrane type and electrolysis conditions. For example, CMX shows the minimal water transport at about 1.5 ml/wafer, the Ionics membrane shows about 5 ml/wafer, and NAFION® membrane shows about 6.5 ml/wafer. The transport properties of the CMX and NAFION® membranes result in the CuSO$_4$/H$_2$SO$_4$ concentration ratio remaining relatively constant, even after about 200 substrates are plated. This indicates that copper acid concentration changes will be lower than 2%, if the penetrated water will be removed, e.g., by enforced evaporation. As such, the use of CMX or NAFION® membrane requires only a small device to accelerate the water evaporation to 4-6 liters/day. However, Ionics membranes require an additional device that extracts the excess of H$_2$SO$_4$ coming from the anolyte. Table 1 illustrates the respective properties of the above noted membranes.

Vicor membranes may also be used to advantage in the plating cell of the invention. Other membranes that may be used in the plating cell of the invention include NEOSEPTA® membranes (ionic and non-ionic) manufactured by Tokuyama, ACIPLEX® membranes, SELEMION® membranes, and Flemion® membranes (all of which are available as ionic and non-ionic) from Asahi Corporation, RAIPARE™ membranes from Pall Gellman Sciences Corporation, and C-class membranes from Solvay Corporation.

TABLE 1

| Membrane | Cu$^{2+}$ transfer, % | Water transfer, ml/Amphr | Resistance ohm cm2 | Cu/Acid Ratio Deviation, % |
|---|---|---|---|---|
| Ionics | 90-95 | 8-11.5 | 53 | 4% |
| NAFION | 95-98 | 4-7.5 | 36 | 2% |
| CMX | 97-98 | 5.0-3.1 | 47 | 1% |

During a plating process, the auxiliary electrode 132 may be biased cathodically or anodically by adjusting a power supply 180 coupled to the auxiliary electrode 132. When the auxiliary electrode 132 is biased cathodically, i.e. the auxiliary electrode 132 functions as a cathode in the electrochemical plating cell 100, plating rate on the substrate near the edge may be reduced and a uniform or even edge thin plating profile may be generated. When the auxiliary electrode 132 is biased anodically, i.e. the auxiliary electrode 132 functions as an anode in the electrochemical plating cell 100, plating rate on the substrate near the edge may be increased and an edge thick plating profile may be generated. Therefore, the plating profile near the edge of the substrate may be adjusted by adjusting the electric bias supplied to the auxiliary electrode 132.

Additionally, the auxiliary electrode 132 may be active (have a cathodic bias applied thereto) for either the entire plating process time (the time when the primary anode, i.e. the anode assembly 105, is active) or for only a portion of the plating process.

Figure 1B:
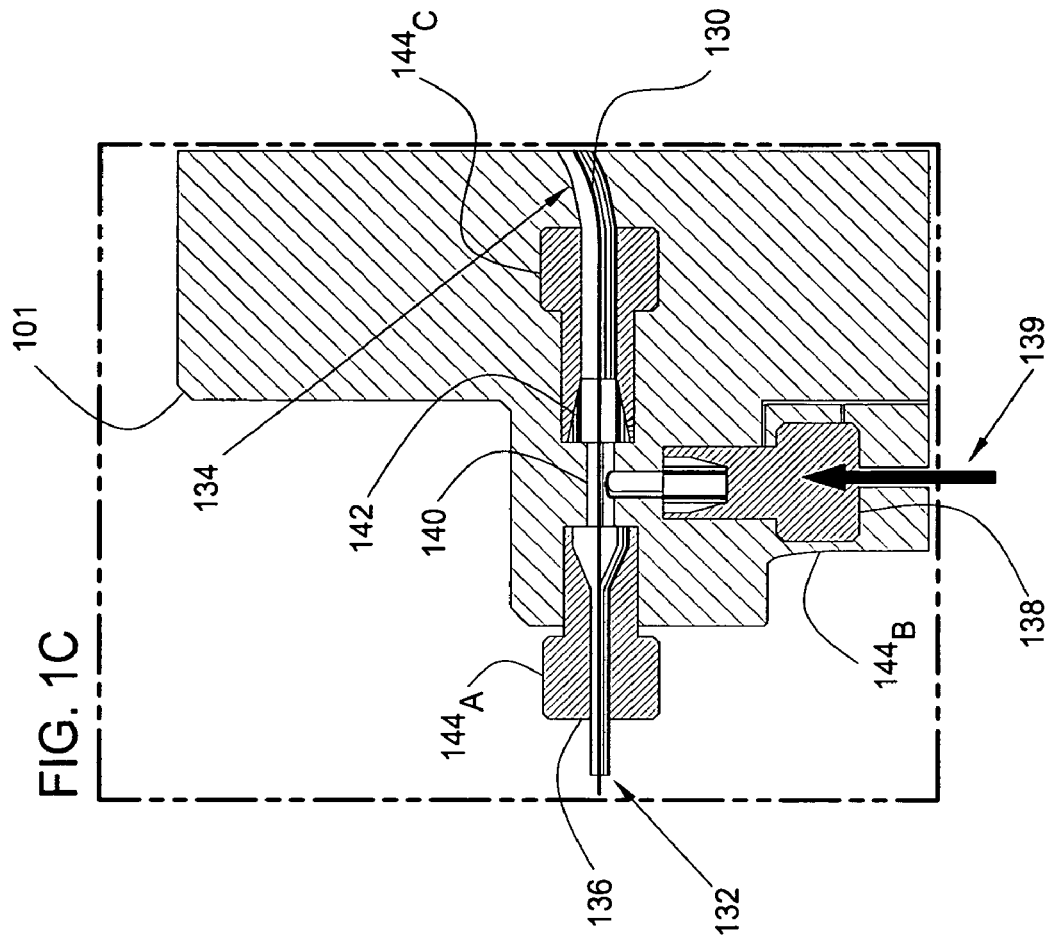
FIG. 1B illustrates an enlarged partial perspective view of the groove displayed in FIG. 1A in which the encased auxiliary electrode is placed.

FIG. 1B illustrates an enlarged partial perspective sectional view of the lower portion of the inner basin 102 containing the groove 120 where the encased auxiliary electrode assembly 130 is placed.

FIG. 1C illustrates an enlarged view of the outer basin 101 of the electrochemical plating cell 100 displayed in FIG. 1A showing how the encased auxiliary electrode assembly 130 enters the electrochemical plating cell 100 through a T-connection 140. After traversing the outer basin 101 of the electrochemical plating cell 100, the encased auxiliary electrode assembly 130 circumnavigates the plating cell within the groove 120 and exits at an outlet 170. Upon entering T-connection 140, the auxiliary electrode 132 is combined with electrolyte from an electrolyte source 190 and enters the protective tube 134 to form the encased auxiliary electrode assembly 130. The T-connection 140 is shown with an electrode inlet 136, an electrolyte inlet 138 and an electrode assembly outlet 142 where the encased auxiliary electrode assembly 130 traverses the wall of the outer basin 101 of the plating cell. The electrode inlet 136, electrolyte inlet 138 and electrode assembly outlet 142 are sealed in a well known manner with seals 144a, 144b and 144c respectively.

The electrolyte, flowing in the protective tube 134, shown by an arrow 139 entering through the electrolyte inlet 138, is different from the catholyte and is kept separate from the catholyte in the catholyte compartment. The electrolyte in the protective tube 134 may come from the anolyte supply or form a dedicated solution stored in an independent tank. The electrolyte in the protective tube 134 can either be flowing or stagnant. There are several advantages to using anolyte in the encased auxiliary electrode assembly 130. First, anolyte does not contain catholyte organics (levelors, suppresors, and activators) which may be quickly consumed or degraded by the auxiliary electrode 132. Second, the use of anolyte is more cost effective than catholyte but still provides the desired conduction. In another embodiment (not shown) the protective membrane adheres directly to the upper surface of the auxiliary electrode and functions without electrolyte.

Figure 1D:
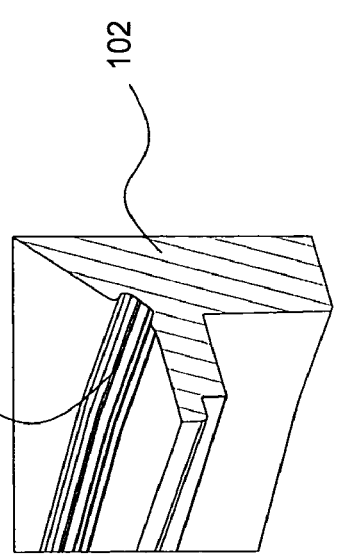
FIG. 1D illustrates an alternate placement of the encased auxiliary electrode assembly.

FIG. 1D illustrates an additional embodiment of the enlarged partial perspective sectional view of the lower portion of the inner basin 102 containing the encased auxiliary electrode assembly 130. The encased auxiliary electrode assembly 130 is positioned between an upper surface 151 of the inner basin 102 and a support member 150. The support member 150 is fastened to the upper surface 151 of the inner basin 102 thus securing the encased auxiliary electrode assembly 130 to the upper surface 151 of the inner basin 102 while also allowing for expansion of the protective tube 134. The support member 150 and upper surface 151 of the inner basin 102 may be welded together, bolted together or fastened using other suitable methods.

Figure 1E:
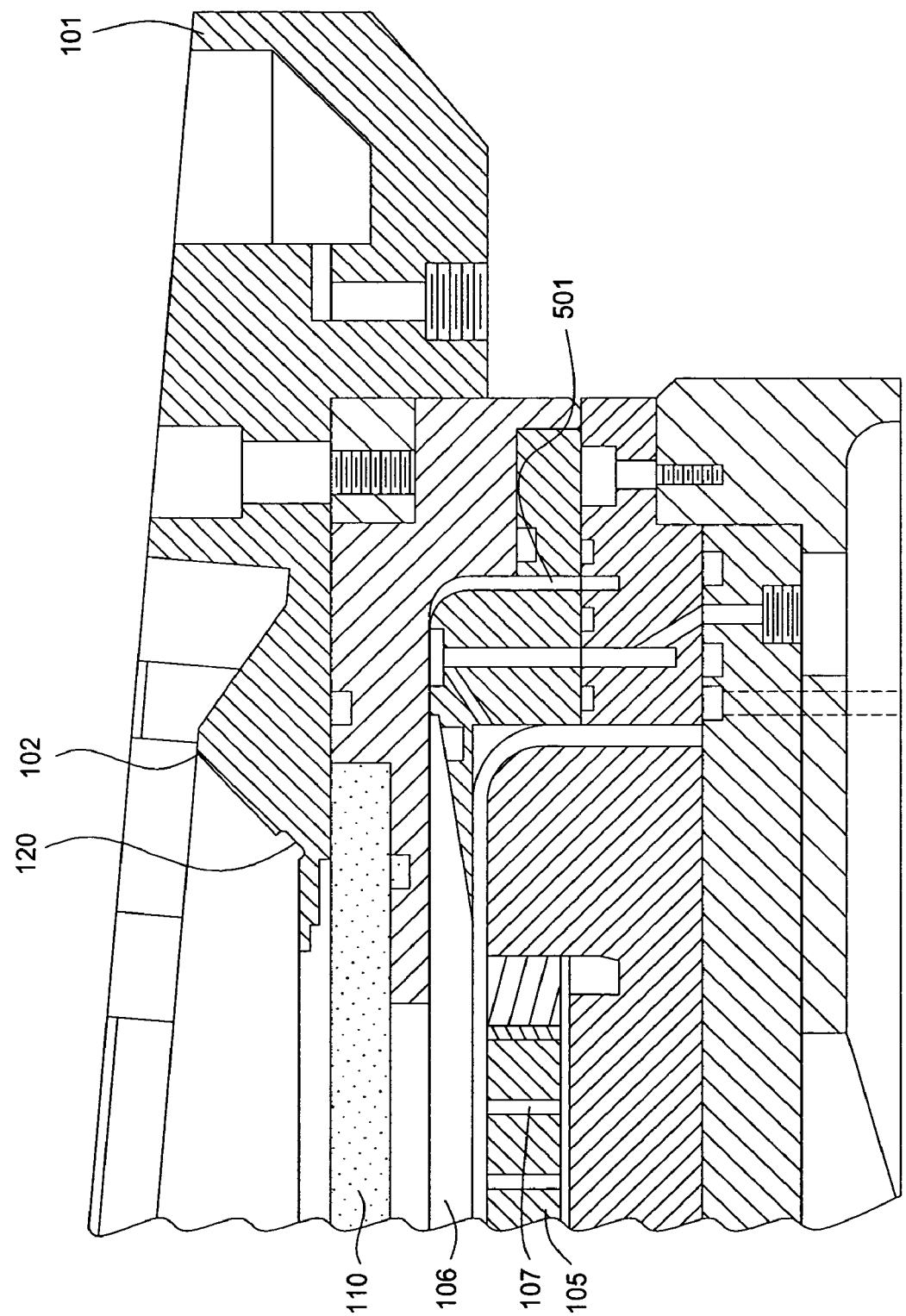
FIG. 1E illustrates a partial sectional view of an edge of the electrochemical plating cell of FIG. 1A.

FIG. 1E shows a partial sectional view of an edge of the electrochemical plating cell 100 showing a groove 120 where the encased auxiliary electrode assembly 130 (FIG. 1B) is generally positioned. The groove 120 is located in the lower portion of the inner basin 102. Air vent/drain 501, which may include multiple ports, is generally positioned on the upper side of the electrochemical plating cell 100, and therefore, is positioned to receive both bubbles trapped within the anode chamber during a plating process, as well as the diluted copper sulfate, for copper plating, generated at the membrane surface. Air vent/drain 501 are generally in fluid communication with the anolyte tank discussed above, and therefore, conducts the diluted copper sulfate received therein back to the anolyte tank, where the diluted copper sulfate may combine with the concentrated copper sulfate removed via anode slots 107 to form the desired concentration of copper sulfate within the anolyte tank. Any bubbles trapped by air vent/drain 501 may also be removed from the cathode chamber vented to the atmosphere or simply maintained within the anolyte tank and not recirculated into the cathode chamber.

Figure 1F:
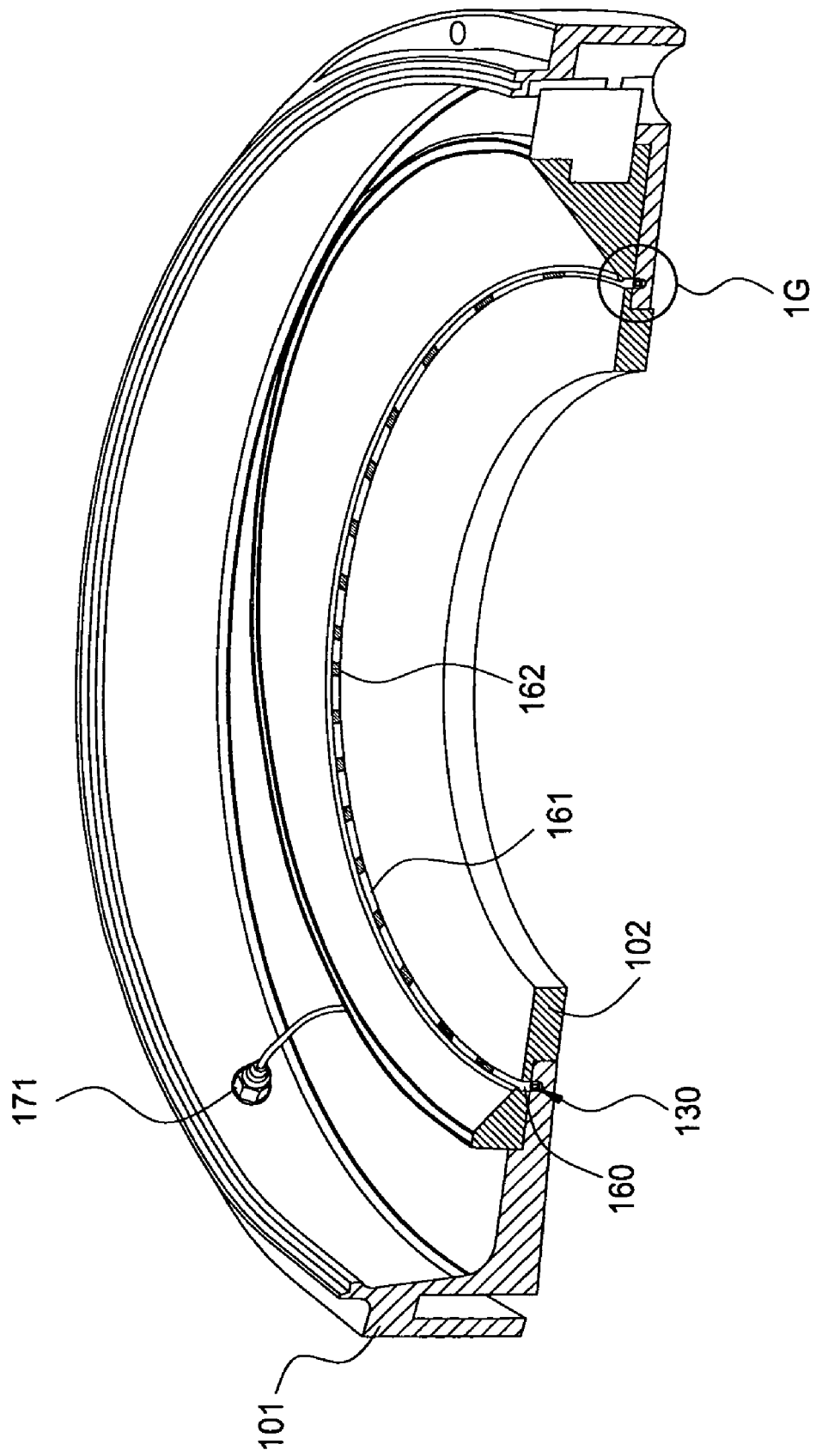
FIG. 1F illustrates one embodiment of placing the encased auxiliary electrode assembly in the electrochemical plating cell of FIG. 1A.

FIG. 1F illustrates one embodiment of placing the encased auxiliary electrode assembly 130 in the electrochemical plating cell 100 of FIG. 1A. The encased auxiliary electrode assembly 130 is disposed in a circular slot 160 formed by two pieces of the fluid basin, for example, the inner basin 102 and the outer basin 101. The slot 160 is in fluid communication with the catholyte chamber via a plurality of windows 161 formed on the inner basin 102. In one embodiment, each of the plurality of windows 161 has the same size and is separated from one another by a plurality of separators 162.

Figure 1H:
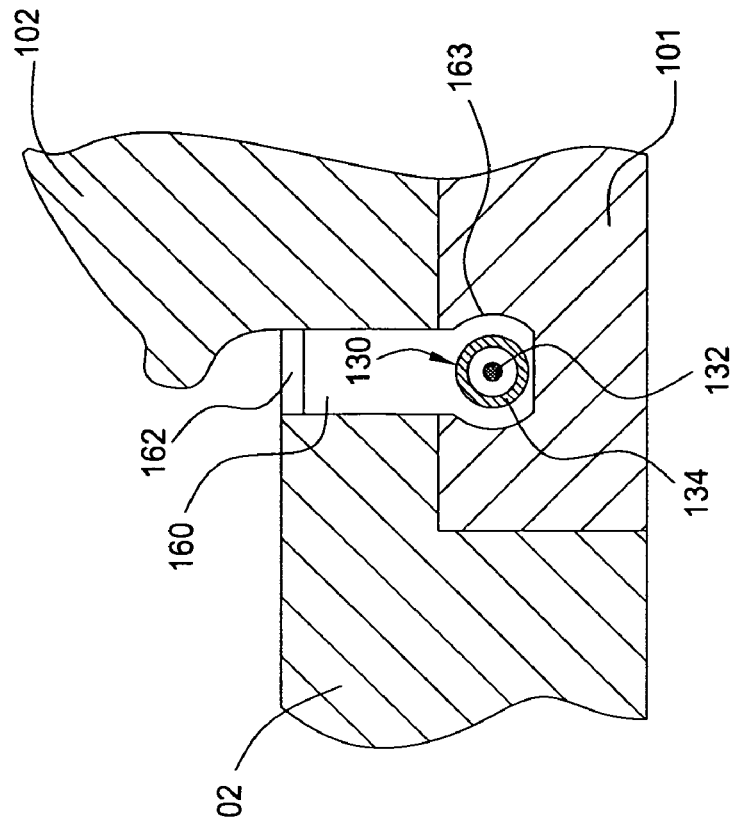
FIG. 1H illustrates an alternate embodiment of a slot for housing the encased auxiliary electrode assembly.
Figure 1G:
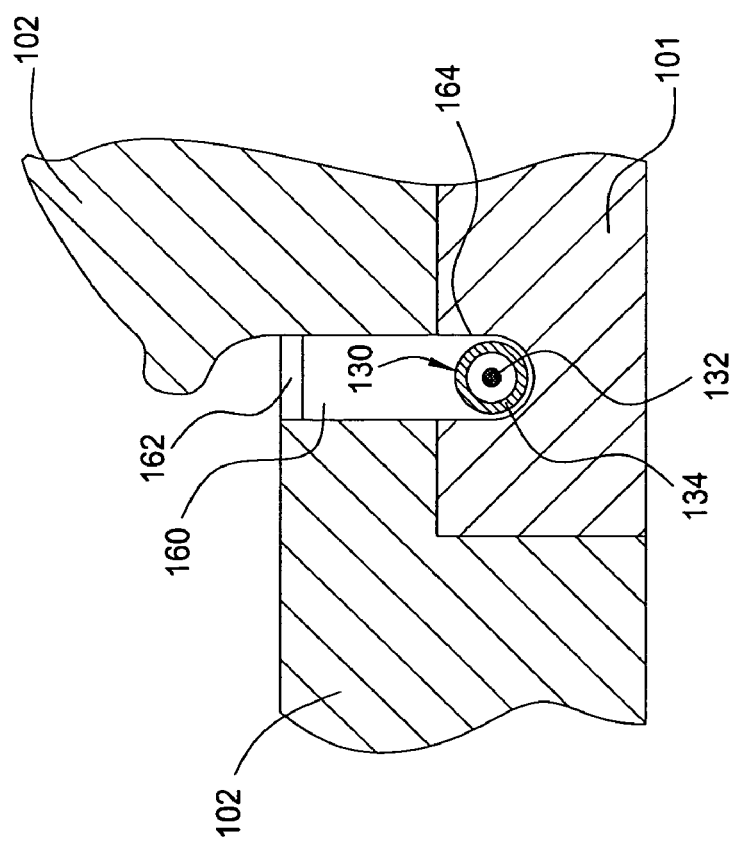
FIG. 1G is a partial enlarged view of FIG. 1F showing a slot for housing the encased auxiliary electrode assembly.

FIG. 1G is a partial enlarged view of FIG. 1F showing a slot for housing the encased auxiliary electrode assembly 130. The slot 160 has a substantially U shaped section. The encased auxiliary electrode assembly 130 is generally disposed in a bottom section 164 of the slot 160.

FIG. 1H illustrates an alternate embodiment of a slot for housing the encased auxiliary electrode assembly 130. The encased auxiliary electrode assembly 130 is generally disposed in a bottom section 163 of the slot 160. The bottom section 163 having a substantially dovetailed shape providing extra volume to accommodate volume gain of the protective tube 134 when the protective tube 134 gets wet.

Figure 1I:
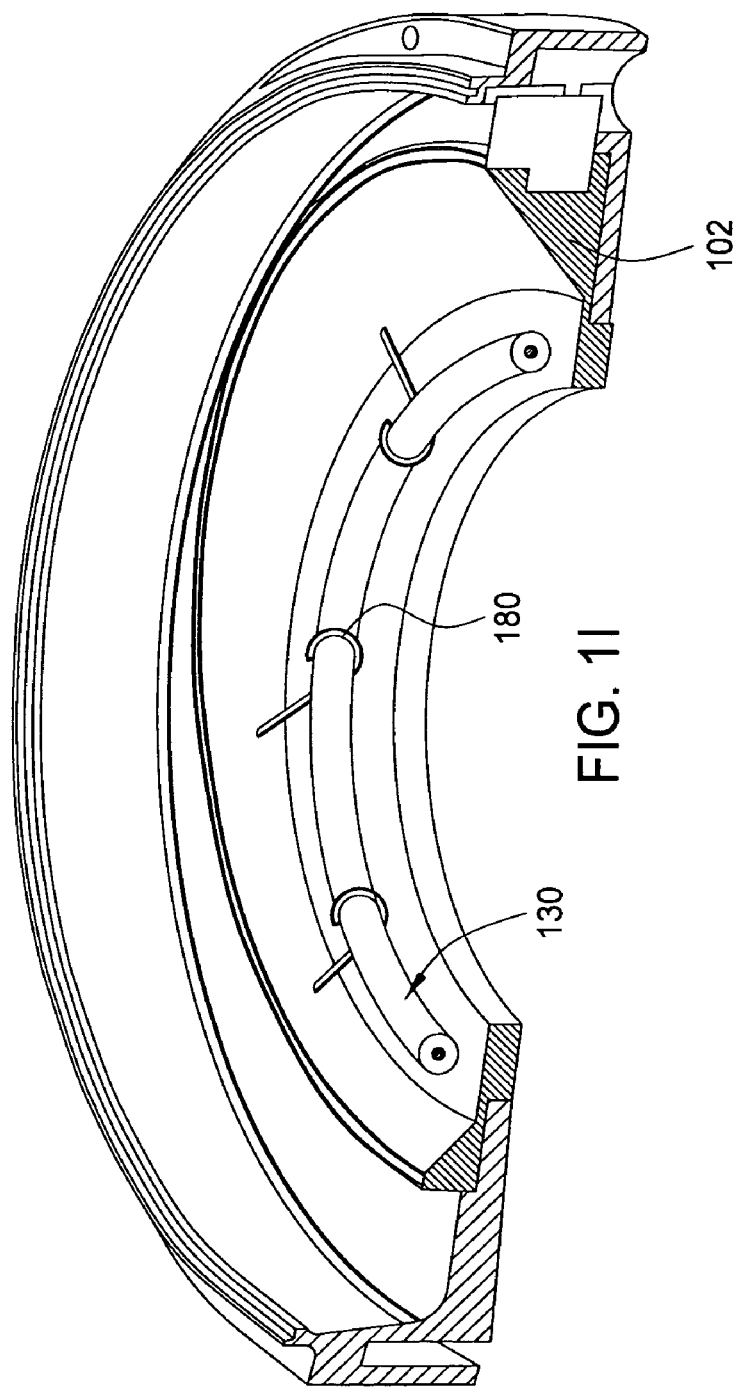
FIGS. 1I and 1J illustrate another embodiment for placing the encased auxiliary electrode assembly in the electrochemical plating cell of FIG. 1A.
Figure 1J:
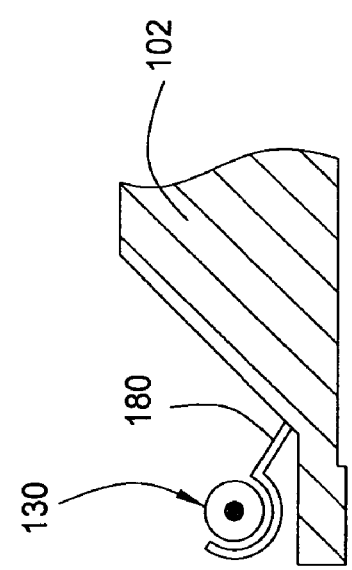

FIGS. 1I and 1J illustrate another embodiment for placing the encased auxiliary electrode assembly 130 in the electrochemical plating cell 100 of FIG. 1A. In this configuration, the encased auxiliary electrode assembly 130 is secured to the inner basin 102 by a plurality of hooks 180 extended from the inner basin 102. The plurality of hooks 180 may be made of non-metal materials, such a inert plastic materials. The plurality of hooks 180 have relatively small impact on the plating solution during process.

Figure 1K:
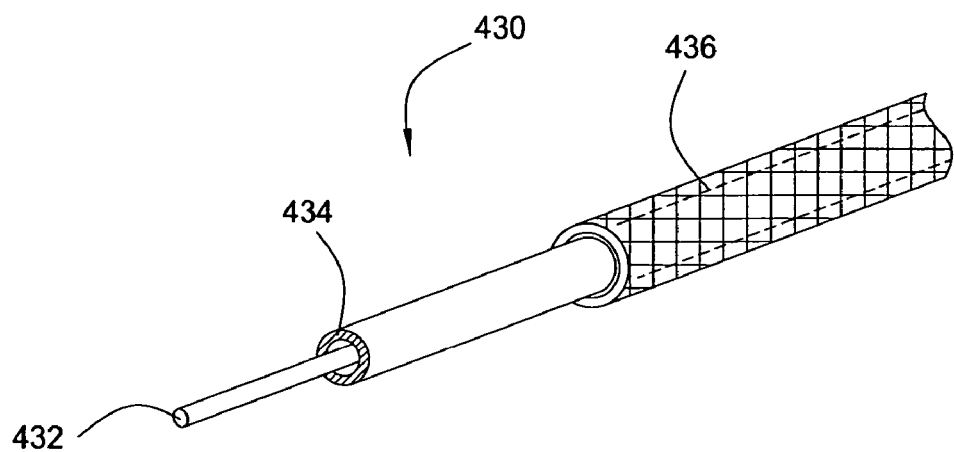
FIG. 1K illustrates an encased auxiliary electrode having a braided sheath in accordance with one embodiment of the present invention.

FIG. 1K illustrates an encased auxiliary electrode 430 having a braided sheath 436 in accordance with one embodiment of the present invention. The encased auxiliary electrode 430 comprises an auxiliary electrode 432 encased in a protective tube 434, which is further incased in the braided sheath 436. The braided sheath 436 may be made from an inert plastic material, such as natural polypropylene, PVDF or TELFON®. In one aspect, the braided sheath 436 provides mechanical strength to the protective tube 434. In another aspect, the braided sheath 436 also contacts the protective tube 434 and ensures a uniform swelling of the protective tube 434 when it gets wet. In one embodiment, the protective tube 434 may have an outer diameter from about 0.110 inch to about 0.220 inch.

Figure 1L:
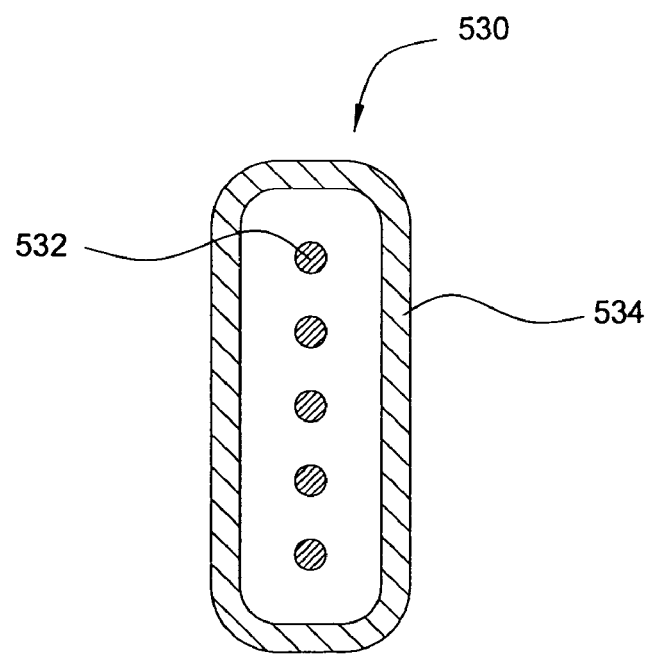
FIG. 1L illustrates an encased auxiliary electrode assembly having a multi-looped electrode encased in a protective tube.

FIG. 1L illustrates an encased auxiliary electrode assembly 530 having a multi-looped electrode 532 encased in a protective tube 534. In one embodiment, the multi-looped electrode 532 is formed by a coiled linear electrode. The multi-looped electrode 532 can pass a higher total current than a single loop electrode because the current is spread over a larger area of the electrode metal surface and the encasing membrane, i.e., the protective tube 534, and thereby avoids limiting transport rates through the protective tube 534 and/or electrolyte inside the protective tube 534 at high current densities. By passing a higher current, a stronger modulation of the plating profile can be achieved. Furthermore, a multi-loop auxiliary electrode can be used to modulate the plating deposition at multiple locations in the plating cell using a single power supply, eliminating the need for multiple power supplies.

Figure 1M:
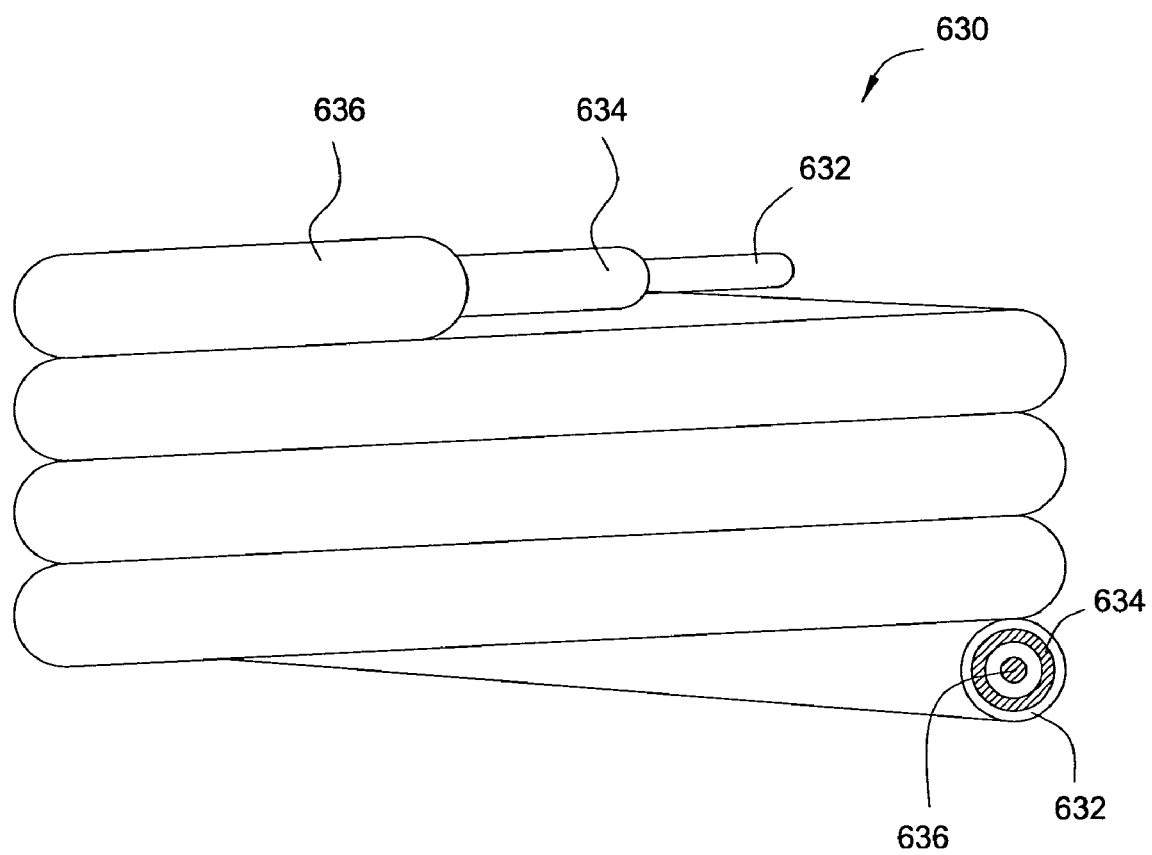
FIG. 1M illustrates a multi-looped auxiliary electrode in accordance with one embodiment of the present invention.

FIG. 1M illustrates a multi-looped auxiliary electrode 630 in accordance with one embodiment of the present invention. The multi-looped electrode 630 is formed by a linear auxiliary electrode coiled to multiple loops. The multi-looped electrode 630 provides similar benefit as the encased auxiliary electrode assembly 530 of FIG. 1L. In one embodiment, the multi-looped auxiliary electrode 630 may comprise an auxiliary electrode 632 encased in a protective tube 534 which is further encased in a braided sheath 636.

Figure 1N:
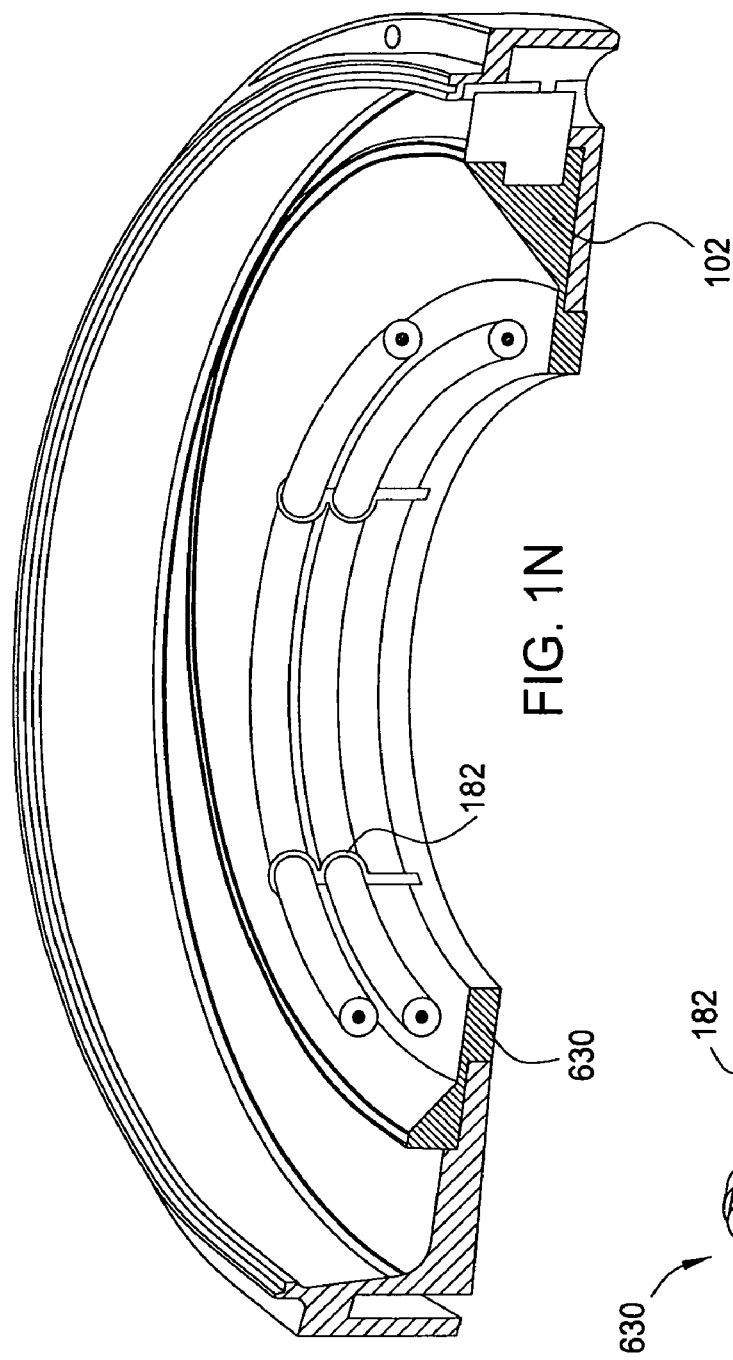
FIGS. 1N and 1O illustrate one embodiment of placing a multi-looped auxiliary electrode in the electrochemical plating cell of FIG. 1A.
Figure 1O:
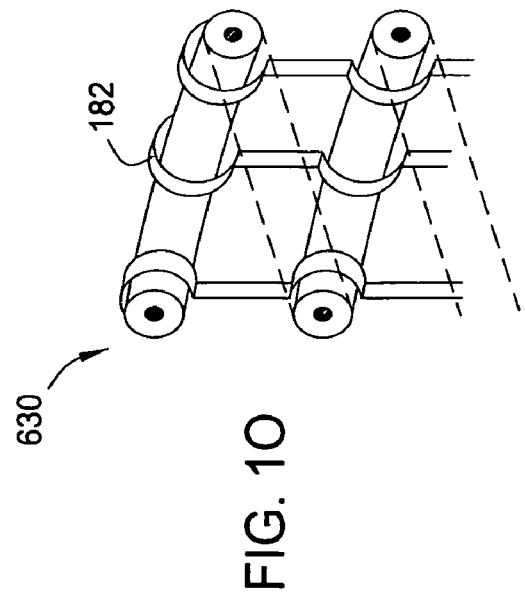

FIGS. 1N and 1O illustrate one embodiment of placing the multi-looped auxiliary electrode 630 of FIG. 1M in the electrochemical plating cell of FIG. 1A. In this configuration, the multi-looped auxiliary electrode 630 is secured to the inner basin 102 by a plurality-of hooks 182 extended from the inner basin 102. Each of the plurality of clips or hooks 182 include multiple arcs to secure the respective loops of the multi-looped auxiliary electrode 630.

Figure 2A:
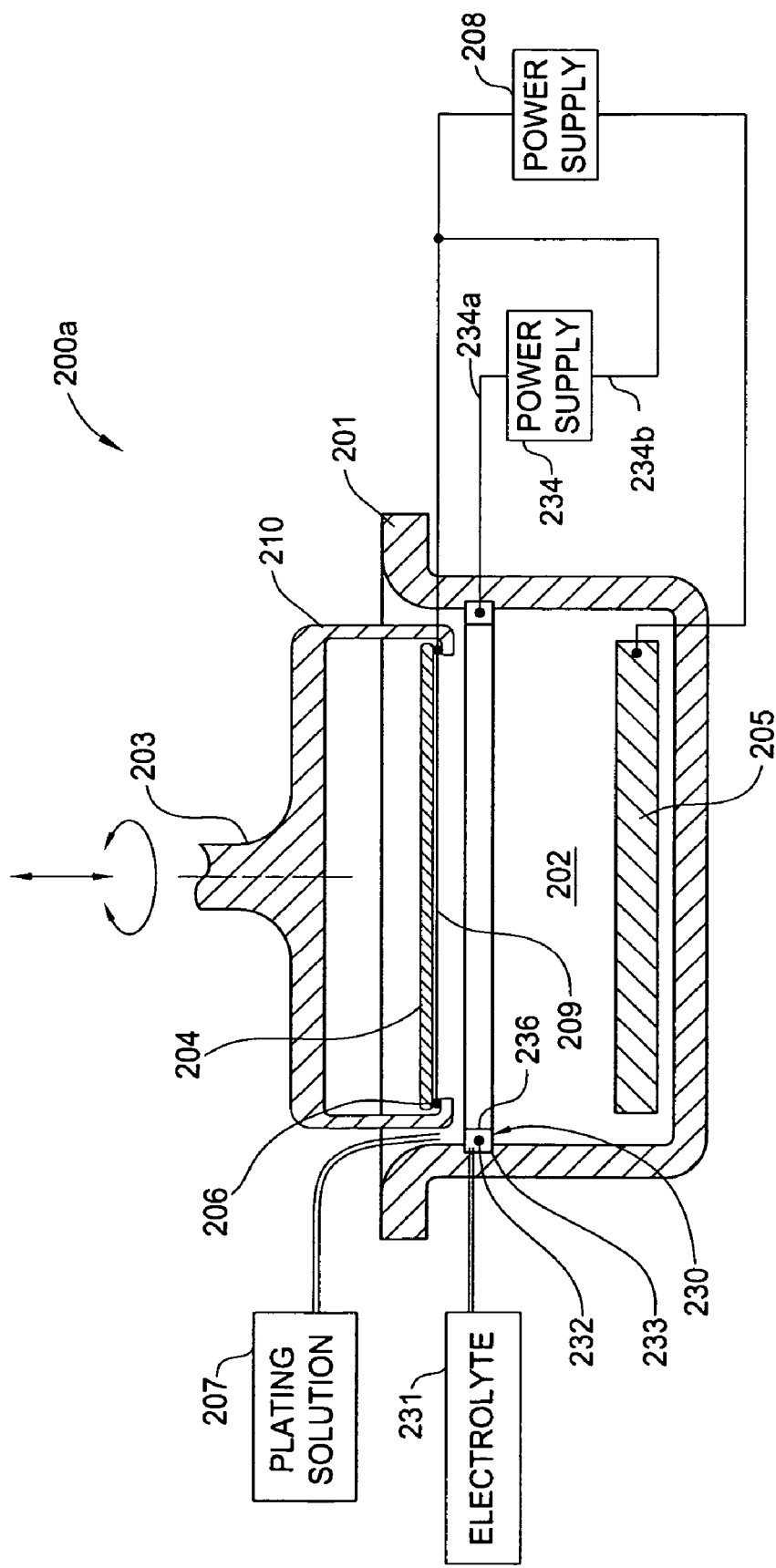
FIG. 2A illustrates a schematic sectional view of an electrochemical plating cell having an encased auxiliary electrode in accordance with one embodiment of the present invention.

FIG. 2A illustrates a schematic sectional view of an electrochemical plating cell 200a having an encased auxiliary electrode assembly 230 in accordance with one embodiment of the present invention. The electrochemical plating cell 200a generally comprises a basin 201 configured to retain a plating solution in a fluid volume 202. A plating solution supply 207 provides plating solution to the fluid volume 202. An anode assembly 205 is generally disposed near the bottom of the basin 201. A carrier head 203 configured to transfer and support a substrate 204 is positioned above the basin 201. The carrier head 203 may move vertically to immerse the substrate 204 to the plating solution disposed in the fluid volume 202 for processing. The carrier head 203 generally comprises a substrate support member 210 having a contact ring 206. The contact ring 206 is configured to support the substrate 204 and to be in electrical contact with a seed layer 209 of the substrate 204 during processing.

The encased auxiliary electrode assembly 230 has a ring shape and coupled to the interior of the basin 201 or supported in the fluid volume 202. The substrate 204 is lowered in to contact with the plating solution to an elevation that places a perimeter of the substrate 204 adjacent the encased auxiliary electrode assembly 230. In one embodiment, the encased auxiliary electrode assembly 230 comprises an auxiliary electrode 232 surrounded by an electrolyte in a protective tube 236. The auxiliary electrode 232 may be made from metals known to be effective as either a soluble or insoluble electrode in an electrochemical plating cell. In one embodiment, the auxiliary electrode 232 may form a loop encased in the protective tube 236. In one embodiment, the encased auxiliary electrode assembly 230 may be positioned in a groove 233 formed on an inner wall of the basin 201. The protective tube 236 is made of an ionic membrane, similar to the protective tube 134 of FIG. 1A, which allows traffic of metal ions between the plating solution in the fluid volume and the auxiliary electrode electrolyte within the encased auxiliary electrode assembly 230. An electrolyte supply 231 may be in fluid communication with the electrolyte within the protective tube 236. In one embodiment, the electrolyte in the protective tube 236 is flowing. In another embodiment, the electrolyte in the protective tube 236 is stagnant.

Figure 2B:
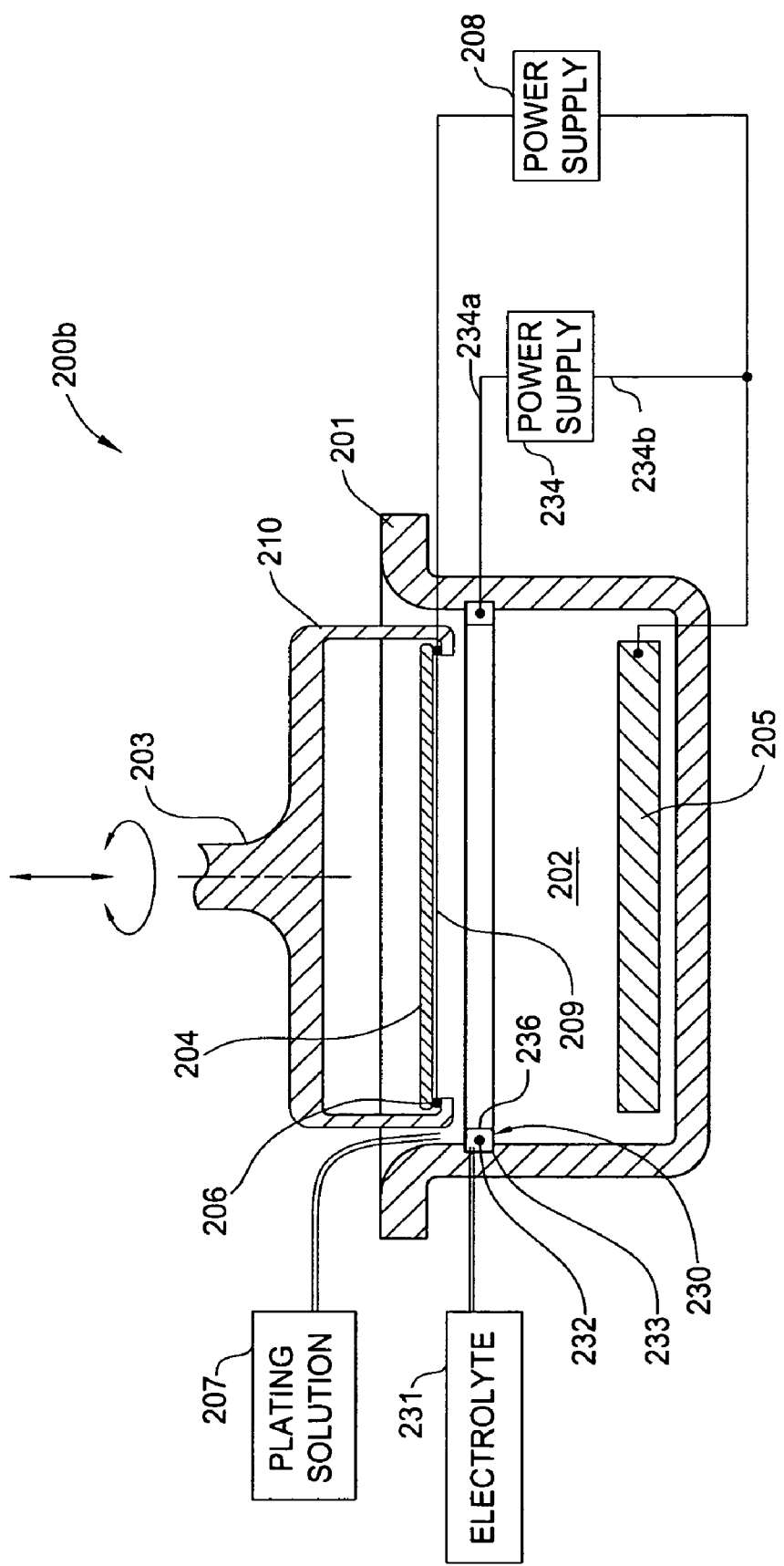
FIG. 2B illustrates a schematic sectional view of an electrochemical plating cell having an encased auxiliary electrode in accordance with one embodiment of the present invention.

A power supply 208 is generally coupled between the anode assembly 205 and the contact ring 206 to provide a plating bias to the substrate 204 during plating. An auxiliary power supply 234 may have a first end of output 234a coupled to the auxiliary electrode 232 and a second end of output 234b coupled to the contact ring 206, hence to the substrate 204. The auxiliary power supply 234 is configured to provide an electric bias to the auxiliary electrode 232 relative to the substrate 204. Alternatively, the electric bias may be provided between the auxiliary electrode 232 and the anode assembly, as in an electrochemical plating cell 200b of FIG. 2B. Optionally, the output 234b may be selectively switched between the anode 205 or the contact ring 206.

The auxiliary electrode 232 may be biased cathodically or anodically by adjusting the auxiliary power supply 234. When the auxiliary electrode 232 is biased cathodically, i.e. the auxiliary electrode 232 functions as a cathode in the electrochemical plating cell 200a, plating rate on the substrate 204 near the edge may be reduced, and a uniform or even edge thin plating profile may be generated. When no substrate is present, cathodically biasing the auxiliary electrode 232 may be used to periodically deplate accumulated metal deposited on the contact ring 206. When the auxiliary electrode 232 is biased anodically, i.e. the auxiliary electrode 232 functions as an anode in the electrochemical plating cell 200a, plating rate on the substrate 204 near the edge may be increased and an edge thick plating profile may be generated. The electric bias applied to the auxiliary electrode 232 may be adjusted by changing a current density or a supply voltage.

It should be noted that the electrochemical plating cell 200a may further comprise a membrane that divides the fluid volume 202 into a cathode chamber and an anode chamber.

Figure 3A:
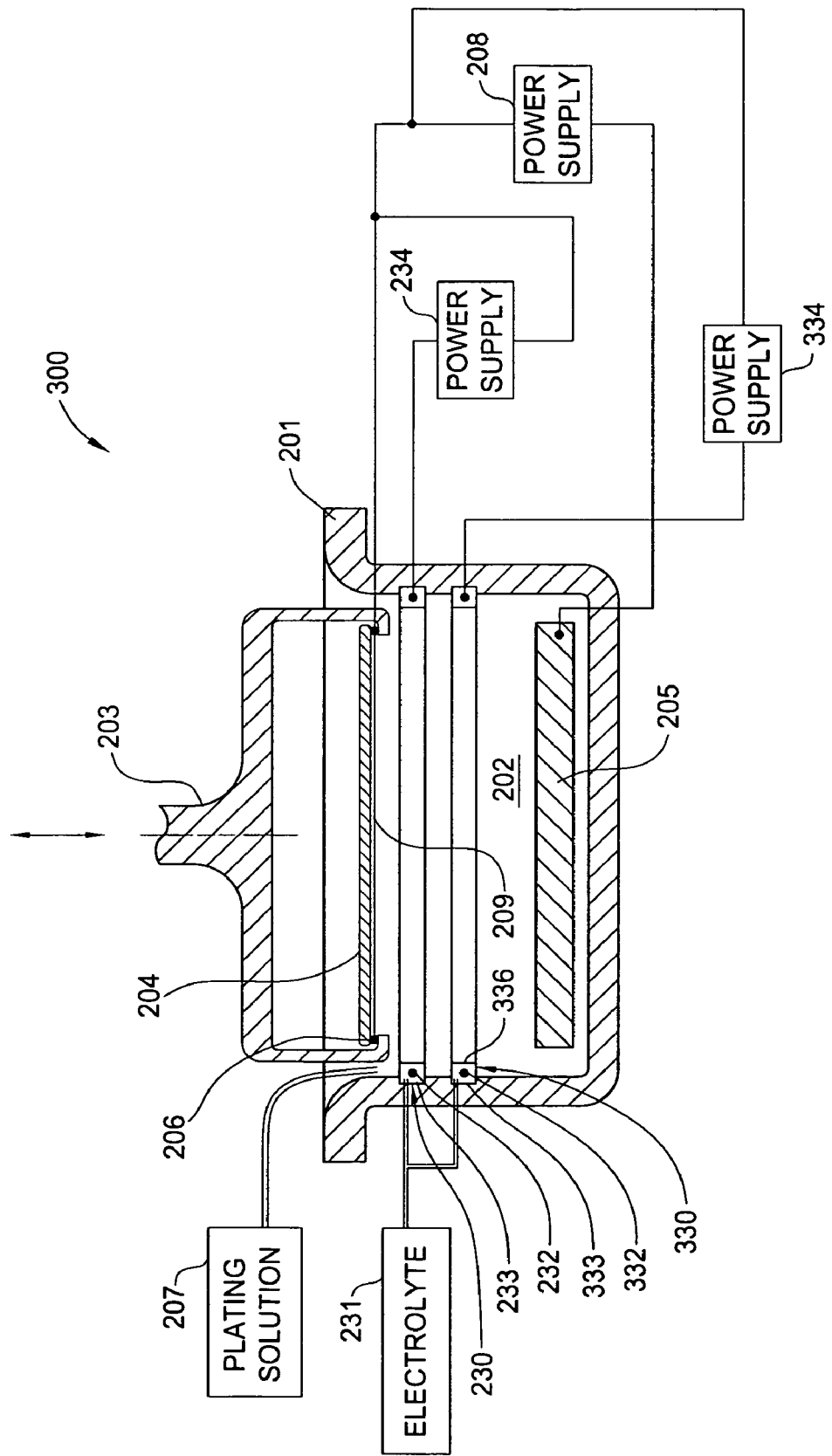
FIG. 3A illustrates a schematic sectional view of an electrochemical plating cell having one or more encased auxiliary electrodes in accordance with one embodiment of the present invention.

FIG. 3A illustrates a schematic sectional view of an electrochemical plating cell 300 having one or more encased auxiliary electrode assemblies in accordance with one embodiment of the present invention. The electrochemical plating cell 300 is similar to the electrochemical plating cell 200a of FIG. 2A. Similar components are identified using the same numeral and will not be described repeatedly. The electrochemical plating cell 300 further comprises a second encased auxiliary electrode assembly 330 similar to the encased auxiliary electrode assembly 230 and disposed vertically below the encased auxiliary electrode assembly 230. The encased auxiliary electrode assembly 330 comprises an auxiliary electrode 332 surrounded by an electrolyte in a protective tube 336. In one embodiment, the electrolyte supply 231 may also provide electrolyte to the second encased auxiliary electrode assembly 330. A second auxiliary power supply 334 and a switch 335 may be used to selectively and independently control the electrical bias supplied to the auxiliary electrode 332 relative to either the anode assembly 205 or the substrate 204. The encased auxiliary electrode assemblies 230 and 330 are configured to independently adjust the electric field in the fluid volume 202 at different vertical elevations.

During process, the substrate 204 may be transferred by the carrier head 203 from above the basin 201 to a plating position located within the fluid volume 202 in the basin 201. During part of the transferring process, the substrate 204 may move vertically within the plating solution in the fluid volume 202. When the substrate 204 is unbiased and in contact with the plating solution, the seed layer 209 may be deplated in the plating solution. To avoid deplating of the seed layer 209, an anti-deplating electrical bias is generally applied to the substrate 204 during the transferring process. However, the anti-deplating bias may cause undesired and usually non-uniform electroplating. In one embodiment, the encased auxiliary electrode assembly 230 may be biased to adjust the electric field near the substrate 204 during part of the transferring process to prevent or reduce this undesirable electroplating, while the second encased auxiliary electrode assembly 330 may be used to adjust the electric field near the substrate 204 in the plating position.

Figure 3B:
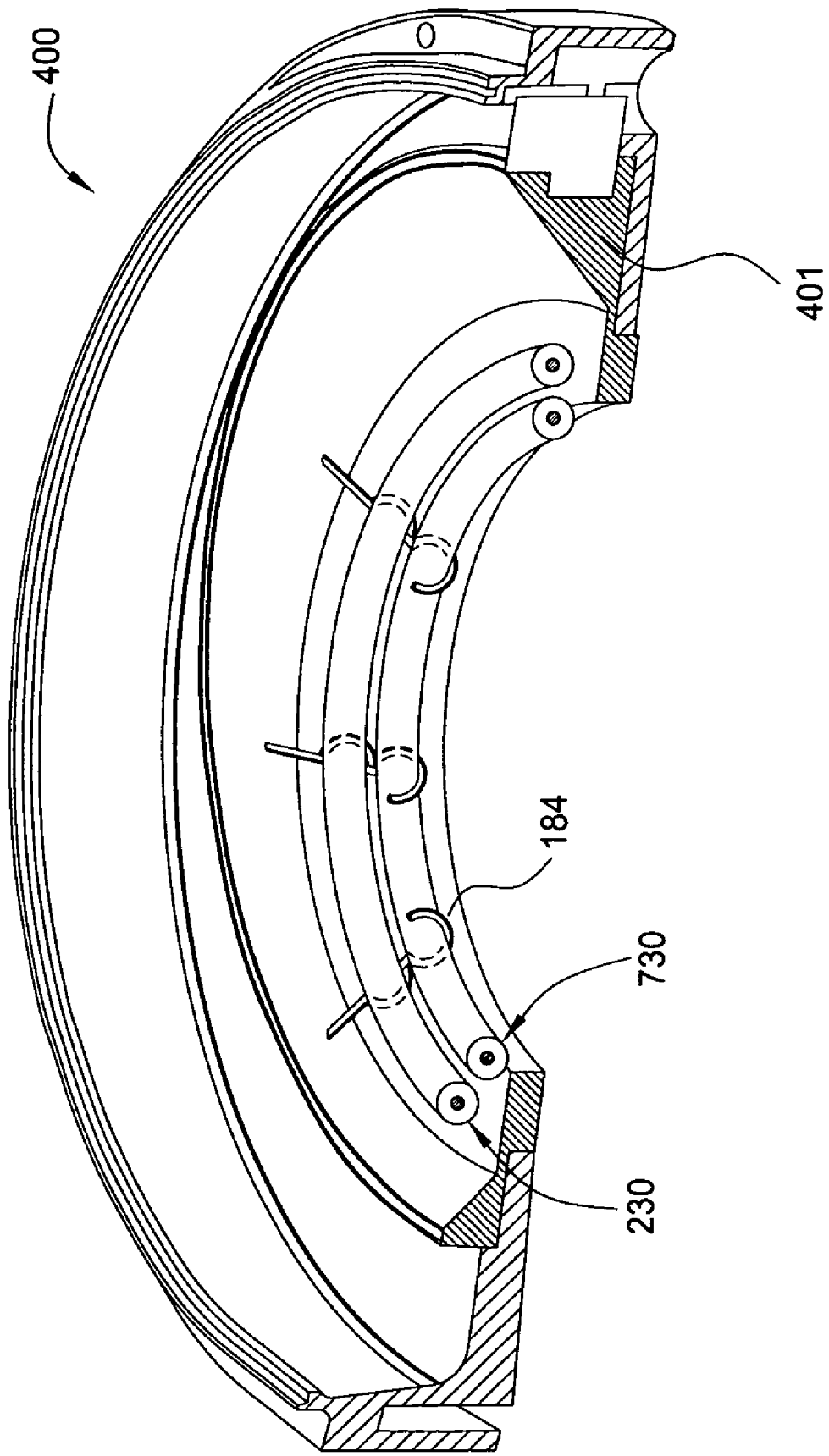
FIG. 3B illustrates another embodiment of an electroplating cell having one or more encased auxiliary electrodes.

FIG. 3B illustrates another embodiment of an electrochemical plating cell 400 having one or more encased auxiliary electrodes. In this configuration, the electrochemical plating cell 4000 comprises a first encased electrode assembly 230 and a second encased auxiliary electrode assembly 730. The second encased auxiliary electrode assembly 730 has a smaller diameter compared to the first encased auxiliary electrode assembly 230. The two encased auxiliary electrode assemblies 230 and 730 are positioned in a concentric manner. In one embodiment, the encased auxiliary electrode assemblies 230 and 730 are secured by a plurality of clips or hooks 184 extended from a fluid basin 401.

FIG. 3C is a partial sectional view of FIG. 3B. The encased auxiliary electrode assemblies 230 and 730 are positioned at the same vertical elevation relative to the substrate 204 being processed. Power, voltage, and/or current supplied to each of the encased auxiliary electrode assemblies 230 and 730 may be controlled independently and configured to adjust electric field at different plating areas of the substrate 204.

FIG. 3D is partial sectional view of an alternative placement of multiple encased auxiliary electrodes assemblies 230 and 830 in the electrochemical plating cell 400. The encased auxiliary electrode assemblies 230 and 830 are positioned at the different vertical elevations relative to the substrate 204 being processed. A plurality of inclined clips or hooks 186 may be used to hold encased auxiliary electrode assemblies 230 and 830 in place.

It should be noted that an electrochemical plating cell comprising more than two encased auxiliary electrode assemblies, each encased auxiliary electrode is configured to adjust the electric field of within the plating cell independently, is also contemplated by the present invention.

In a tilted electrochemical plating cell, such as the electrochemical plating cell 100 of FIG. 1A, a tilted carrier head assembly and substrate support member may be utilized to immerse the substrate at a constant immersion angle, i.e., immerse the substrate such that the angle between the substrate and the upper surface of the electrolyte does not change during the immersion process, or alternatively, at an angle that varies during the immersion process. Therefore, in a titled electrochemical plating cell, an immersing step is generally involved when transferring the substrate to the plating position. The immersion process generally includes from the substrate first in contact with the plating solution to the substrate completely immersed in the plating solution.

Figure 4:
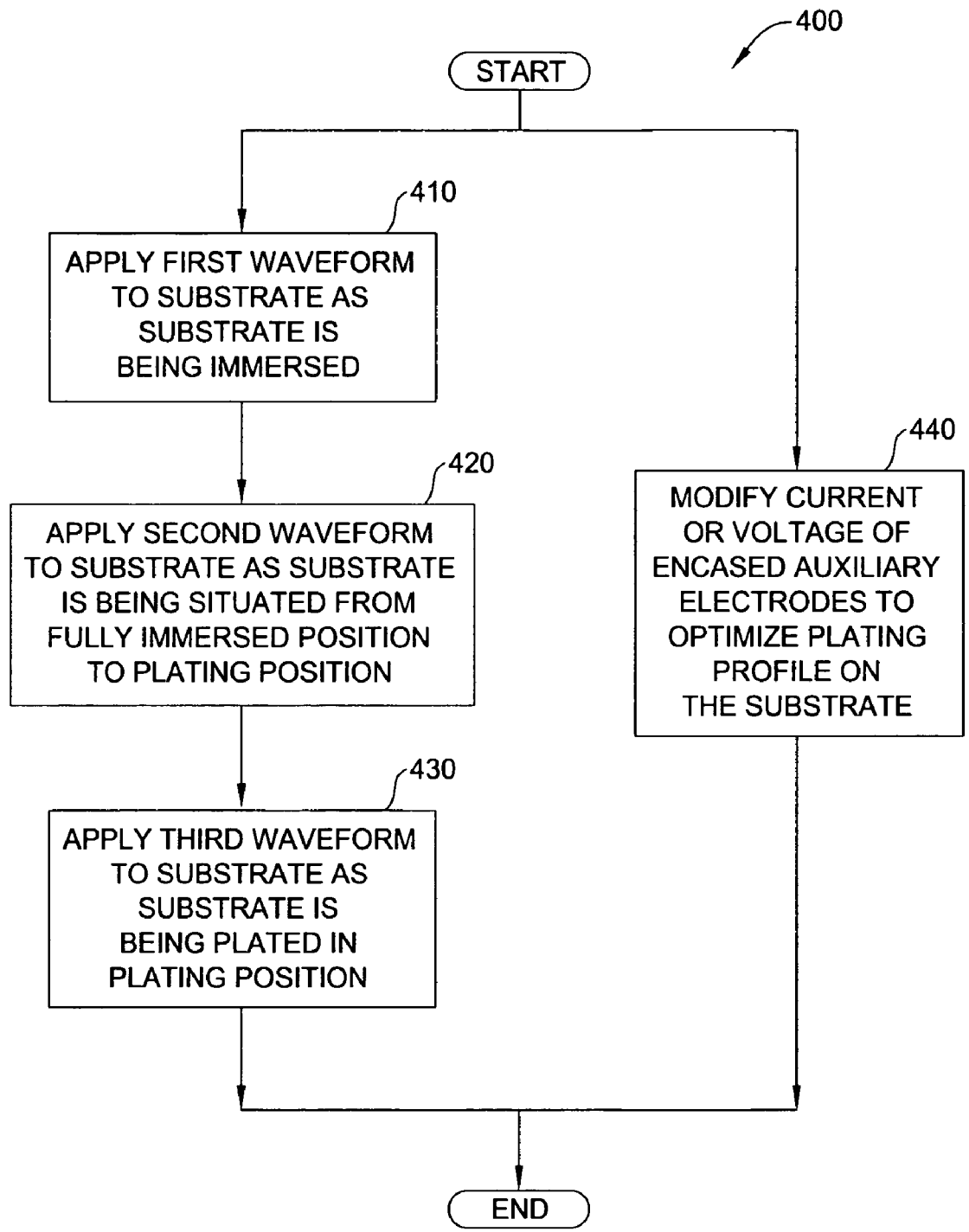
FIG. 4 illustrates a flow diagram of a method for plating a metal on a substrate in accordance with one or more embodiments of the present invention.

FIG. 4 illustrates a flow diagram of a method 400 for plating a substrate in accordance with one or more embodiments of the present invention. This method 400 involves modulating the current density applied to the substrate in a manner that is synchronized with the substrate's motion and exerting strict control of the current density uniformity across the substrate surface. This approach targets at least the first few seconds of plating (or the first 50 to about 200 Å of deposition) when features are filled.

The steps 410 and 420 involve development of an optimized waveform that is applied to the substrate during the initial seconds of plating including the immersion sequence. Details of the immersion sequence and waveform development are described in U.S. patent application Ser. No. 11/052,443, entitled "Immersion Process For Electroplating Applications," assigned to Applied Materials, Inc., filed Feb. 7, 2005 and herein incorporated by reference. The waveform consists of several steps whose durations and amplitudes are tuned to protect the seed-layer induce bottom-up growth, and achieve void-free fill. The steps are closely synchronized with the trajectory of the substrate as it is immersed and moved into its final plating position.

The next step 430 involves applying a third waveform, i.e., a plating waveform, to the substrate being plated.

Step 440 may be performed simultaneously during steps 410, 420 and 430. The step 440 involves dynamic control of the instantaneous current density in the plating system to optimize plating profile on the substrate. This is achieved by adjusting a current density or voltage of the encased auxiliary electrode(s) in time to produce a desired plating profile, such as a uniform plating profile, or an edge thin profile, or an edge thick profile. The step 440 may be performed at any one, at any combination or at all the steps 410 to 430. In another embodiment, step 440 is only performed during the plating step 430.

Figure 5A:
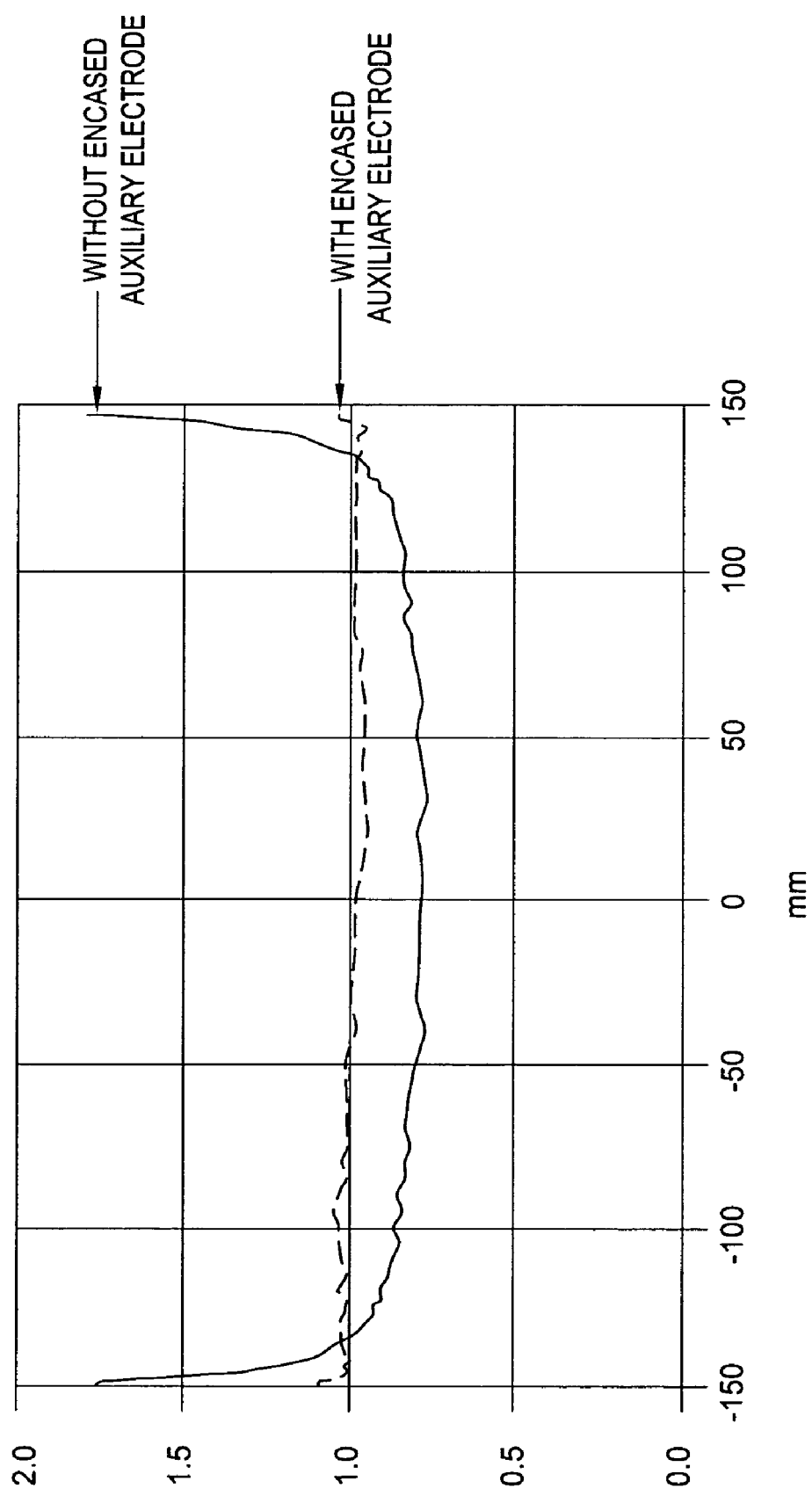
FIG. 5A is a plating thickness plot for a plating cell with an encased auxiliary electrode assembly in fluid communication with a plating solution compared to an electrochemical plating cell without the encased auxiliary electrode assembly.

FIG. 5A illustrates the application of this invention to mitigate the terminal effect. FIG. 5A shows a plating thickness plot for a plating cell with the encased auxiliary electrode assembly in fluid communication with the plating solution compared to an electrochemical plating cell without the encased auxiliary electrode assembly. The substrate plated had a diameter of 300 mm. This specific example is for 200 Å Cu plated on a 300 Å Cu seed layer. With proper application of a bias to an encased auxiliary electrode, the terminal effect is overcome and a substantially flat uniform profile is achieved. The encased auxiliary electrode may provide similar results for other seed layers, current densities, and plating thicknesses with an appropriate current or voltage applied to the auxiliary electrode.

Figure 5B:
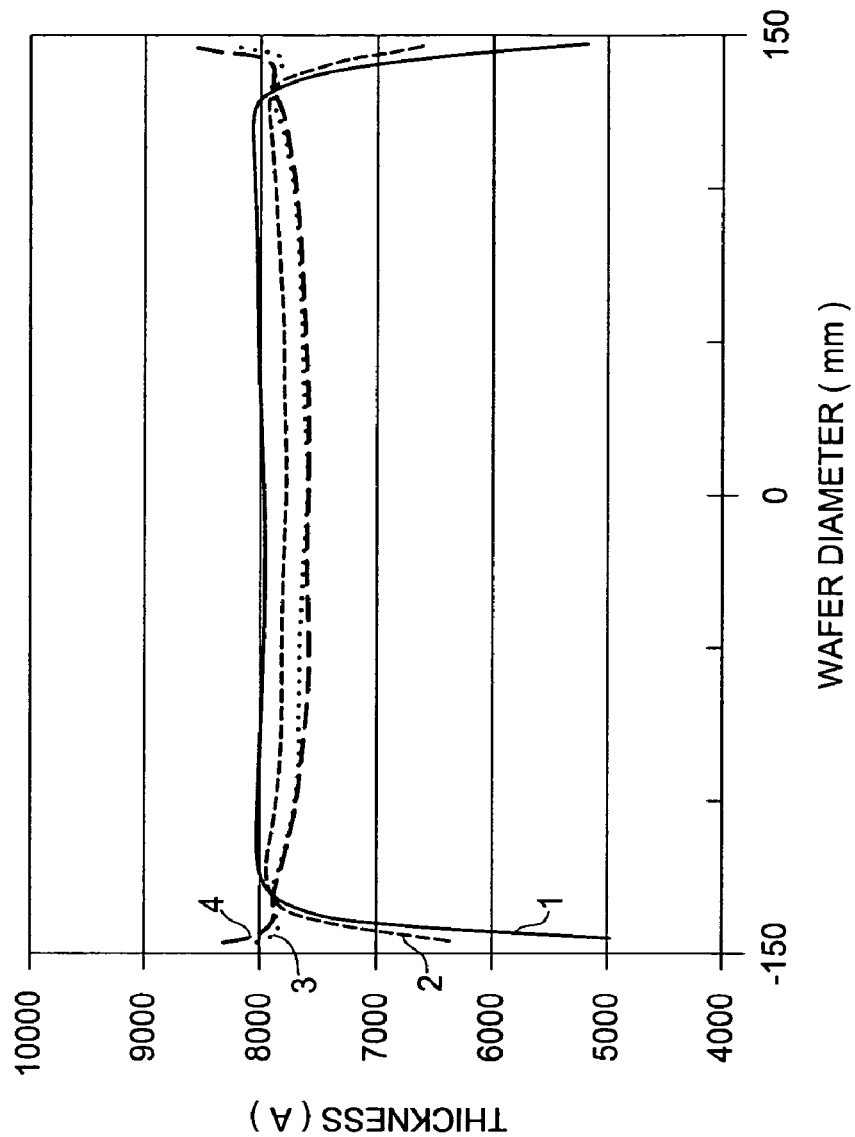
FIG. 5B is a plating thickness plot illustrates application of the present invention for adjusting plating profile.

FIG. 5B is a plating thickness plot illustrating that application of the present invention in adjusting the plating profile. FIG. 5B shows plating thickness results of a 300 mm substrate after a 8000 Å plating process in an electrochemical plating cell having an encased auxiliary electrode of the present invention. Curve 3 shows the result when the auxiliary electrode is not biased. Curve 1 shows the result of a plating process when the auxiliary electrode is cathodically biased with a high current value. Curve 2 shows the result of a plating process when the auxiliary electrode is cathodically biased with a low current value. Curve 4 shows the result of a plating process when the auxiliary electrode is anodically biased. FIG. 5B shows that a plating profile may be adjusted by applying different biases to the auxiliary electrode.

Figure 5C:
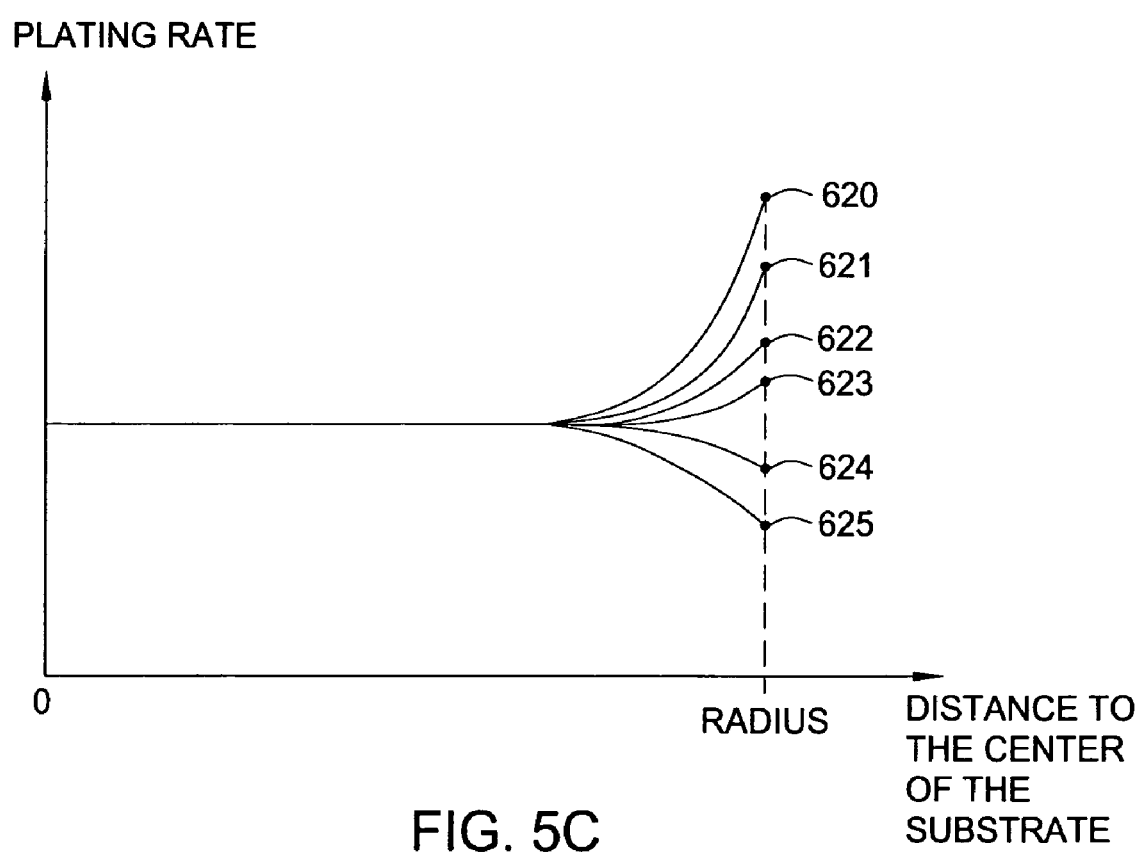
FIG. 5C schematically illustrates exemplary profiles of plating rate may be obtained by the electrochemical plating cell of the present invention.

FIG. 5C illustrates the application of the present invention to adjust the overall plating profile. The horizontal axis indicates the distance from the center of the substrate and the vertical axis indicates the plating profile across the fully plated substrate. Curves 620-625 illustrate a plurality of plating rate profiles along a radius of the substrate being processed. The curves 620-625 illustrate plating effects ranged from edge thick to edge thin which may be applied to different substrates or during a different time period of the plating process. The curves 620-625 may be obtained by adjusting the electric bias applied to the encased auxiliary electrode assembly (assemblies) positioned near the edge of the substrate.

Figure 6:
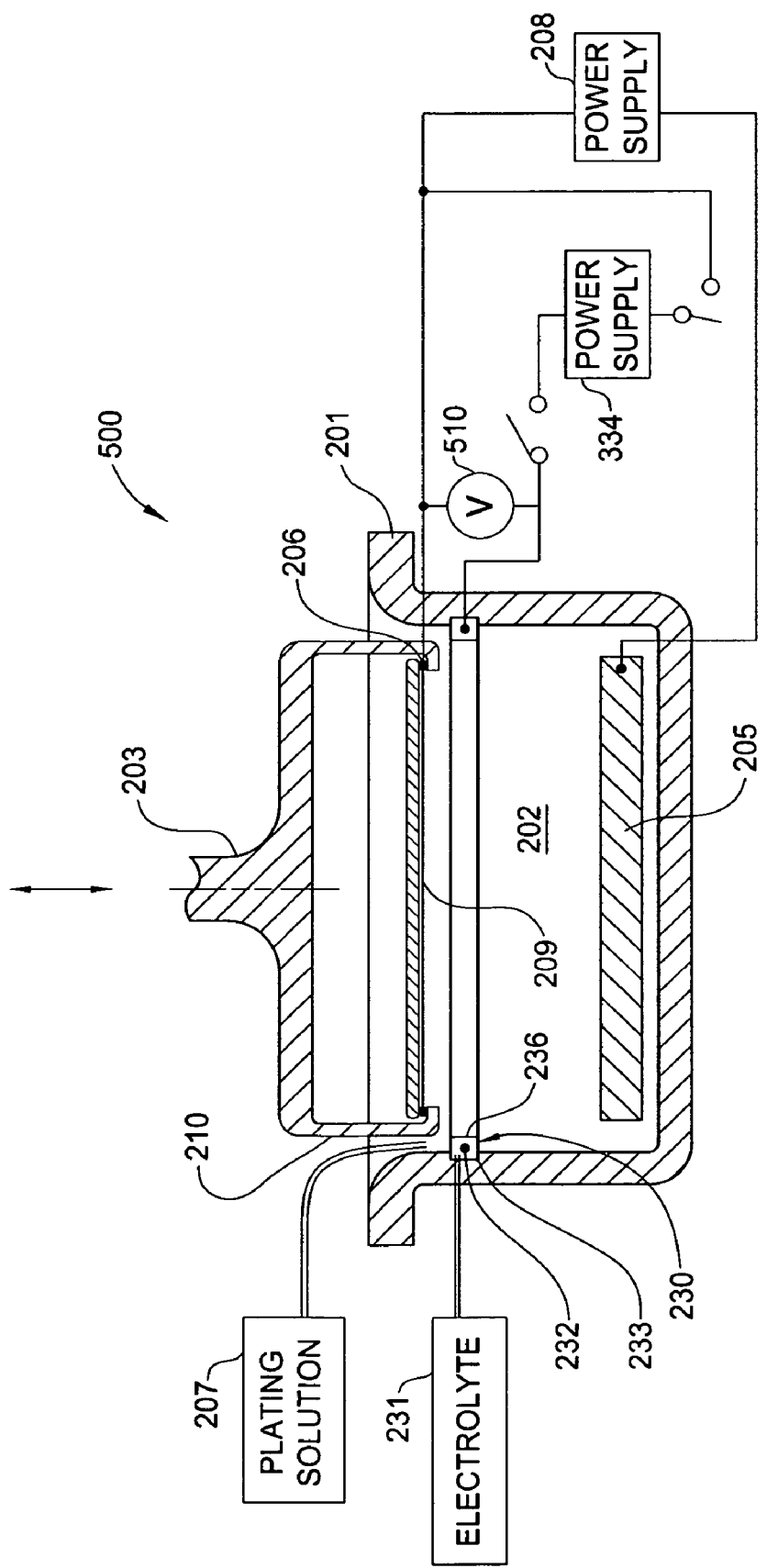
FIG. 6 illustrates a schematic sectional view of an electrochemical plating cell of the present invention wherein an encased auxiliary electrode is used as a reference electrode.

FIG. 6 is a schematic sectional view of an electrochemical plating cell 500 of the present invention wherein an encased auxiliary electrode assembly 230 is used as a reference electrode. The is a further application of the present invention. The electrochemical plating cell 500 is similar to the electrochemical plating cell 200a of FIG. 2A. Similar components are identified using the same numeral and will not be described repeatedly. The auxiliary electrode 232 is in fluid communication with a plating solution retained in the basin 201 through the protective tube 236. The auxiliary power supply 234 is cut off from the auxiliary electrode 232 which is electrically "floating" in the plating solution. A voltmeter 510 coupled between the contact ring 206 and the encased auxiliary electrode may be used to measure a voltage value near the perimeter of the substrate. This voltage may be used to diagnose problems within the electrochemical plating cell 500 and assess the optimal condition of the plating process.

While the foregoing is directed to embodiments of the present invention, other and further embodiments of the invention may be devised without departing from the basic scope thereof, and the scope thereof is determined by the claims that follow.

What is claimed is:

1. An apparatus for electrochemically plating a substrate, comprising:
    a fluid basin configured to retain a plating solution therein;
    an anode assembly disposed in the fluid basin;
    a substrate support member configured to retain the substrate and contact the substrate electrically; and
    a first encased auxiliary electrode assembly comprising an auxiliary electrode surrounded by an electrolyte solution enclosed within a protective tube, wherein the first encased auxiliary electrode assembly is disposed in the fluid basin.

2. The apparatus of claim 1, wherein the first encased auxiliary electrode assembly forms a loop.

3. The apparatus of claim 1, wherein the protective tube is encased in a braided sheath.

4. The apparatus of claim 1, wherein the protective tube comprises an ion exchange material based on a fluorinated polymer matrix.

5. The apparatus of claim 1, wherein the protective tube is has a stagnant volume of the electrolyte solution disposed therein.

6. The apparatus of claim 1, wherein the protective tube is coupled to an electrolyte supply configured to provide and circulate the electrolyte solution through the protective tube.

7. The apparatus of claim 6, the auxiliary electrode is coupled to an adjustable power supply.

8. The apparatus of claim 6, the auxiliary electrode is coupled to a voltage meter.

9. The apparatus of claim 6, further comprising a second encased auxiliary electrode assembly disposed in the fluid basin below the first encased auxiliary electrode assembly.

10. The apparatus of claim 6, further comprising a second encased auxiliary electrode assembly disposed in the fluid basin, wherein the first encased auxiliary electrode assembly has a larger diameter than the second encased auxiliary electrode assembly and the first and second encased auxiliary electrode assemblies are disposed concentrically.

11. The apparatus of claim 10, wherein the second auxiliary electrode assembly has a diameter smaller than the diameter of the substrate.

12. The apparatus of claim 1, wherein the first encased auxiliary electrode assembly is a multi-loop auxiliary electrode.

13. The apparatus of claim 1, wherein the auxiliary electrode forms a coil with multiple loops.

14. An electrochemical plating cell, comprising:
   an anolyte compartment positioned in a lower portion of a fluid basin;
   an anode positioned in the anolyte compartment;
   a catholyte compartment, positioned in an upper portion of the fluid basin, in ionic communication with the anolyte compartment via a cationic membrane;
   a cathode substrate support member positioned to support a substrate at least partially in the catholyte compartment; and
   an encased auxiliary electrode assembly, positioned inside the fluid basin, wherein the auxiliary electrode assembly comprises an auxiliary electrode disposed in a protective tube, and wherein the protective tube is coupled to an electrolyte supply configured to circulate an electrolyte solution through the protective tube.

15. The plating cell of claim 14, wherein the encased auxiliary electrode assembly is positioned in a slot formed in the fluid basin, the slot having a plurality of windows open to the catholyte compartment.

16. The plating cell of claim 14, further comprising a plurality of hooks extending from an inner wall of the fluid basin, the plurality of hooks are configured to secure the encased auxiliary electrode assembly in the catholyte compartment.

17. The plating cell of claim 14, wherein the auxiliary electrode is substantially circular and is positioned approximate an edge of the substrate when the substrate is in a plating position.

18. The plating cell of claim 14, wherein the protective tube comprises an ion exchange material based on a fluorinated polymer matrix.

19. The plating cell of claim 18, wherein the ion exchange material comprises a perfluorinated polymer containing at least one of sulfonic and carboxylic ionic functional groups.

20. The plating cell of claim 14, wherein the auxiliary electrode is coupled to an adjustable power supply.

21. The plating cell of claim 20, wherein the adjustable power supply provides an adjustable current to the auxiliary electrode.

22. The plating cell of claim 20, wherein the adjustable power supply provides an adjustable voltage to the auxiliary electrode.

23. A method for plating a metal onto a substrate, comprising:
   positioning the substrate in a plating position in a plating solution;
   applying a first electrical bias between the substrate and an anode disposed in the plating solution; and
   during applying the first electrical bias, applying a second electrical bias to an auxiliary electrode positioned in a protective tube disposed in the plating solution while flowing an electrolyte solution through the protective tube.

24. The method of claim 23, wherein the second electrical bias is adjusted dynamically to achieve a desired plating profile on the substrate.

25. The method of claim 23, further comprising:
   applying a first waveform between the substrate and the anode from when the substrate is first in contact with the plating solution to when the substrate is completely immersed in the plating solution;
   applying a second waveform between the substrate and the anode from when the substrate is completely immersed in the plating solution to when the substrate is in the plating position; and
   adjusting the second electrical bias during applying the first and second waveforms.

26. The method of claim 23, wherein the second electrical bias is applied between the anode and the auxiliary electrode.

27. The method of claim 23, wherein the second electrical bias is applied between the substrate and the auxiliary electrode.

* * * * *